United States Patent
Gnan et al.

(10) Patent No.: US 11,378,657 B2
(45) Date of Patent: Jul. 5, 2022

(54) TIME OF FLIGHT SENSOR WITH LIGHT BAFFLE SYSTEM AND METHOD

(71) Applicant: Datalogic IP Tech, S.r.l., Bologna (IT)

(72) Inventors: Marco Gnan, Bologna (IT); Paolo Quattrini, Sala Bolognese (IT)

(73) Assignee: Datalogic IP Tech, S.r.l., Bologna (IT)

(*) Notice: Subject to any disclaimer, the term of this patent is extended or adjusted under 35 U.S.C. 154(b) by 1367 days.

(21) Appl. No.: 15/672,125

(22) Filed: Aug. 8, 2017

(65) Prior Publication Data
US 2019/0049585 A1 Feb. 14, 2019

(51) Int. Cl.
| | |
|---|---|
| *G01S 7/481* | (2006.01) |
| *G01J 1/02* | (2006.01) |
| *H03K 17/945* | (2006.01) |
| *G01V 8/10* | (2006.01) |
| *G01S 17/894* | (2020.01) |
| *G01S 7/4912* | (2020.01) |
| *G01J 1/04* | (2006.01) |
| *G01J 1/42* | (2006.01) |

(52) U.S. Cl.
CPC .......... *G01S 7/4813* (2013.01); *G01J 1/0214* (2013.01); *G01S 17/894* (2020.01); *G01V 8/10* (2013.01); *H03K 17/945* (2013.01); *G01J 1/0422* (2013.01); *G01J 2001/4247* (2013.01); *G01S 7/4918* (2013.01)

(58) Field of Classification Search
CPC .... G01S 7/4813; G01S 7/4918; G01S 17/894; G01J 1/0214; G01J 2001/4247; G01V 8/10; H03K 17/945
See application file for complete search history.

(56) References Cited

U.S. PATENT DOCUMENTS

| | | | |
|---|---|---|---|
| 8,232,883 B2 | 7/2012 | Yao et al. | |
| 9,202,833 B2* | 12/2015 | Mackey | H01L 27/14627 |
| 9,952,035 B2* | 4/2018 | Uedaira | G01S 17/04 |
| 2003/0067680 A1* | 4/2003 | Weinstein | G02B 21/002 |
| | | | 359/372 |
| 2012/0188171 A1* | 7/2012 | Alameh | H03K 17/9631 |
| | | | 345/173 |

(Continued)

FOREIGN PATENT DOCUMENTS

| | | | | |
|---|---|---|---|---|
| CN | 102290342 A | * | 12/2011 | |
| EP | 3057142 A2 | * | 8/2016 | G01J 1/0209 |

*Primary Examiner* — Yuqing Xiao
*Assistant Examiner* — Amanda J Webster
(74) *Attorney, Agent, or Firm* — Cozen O'Connor

(57) ABSTRACT

A time of flight sensor system having a time of flight sensor layer is disclosed. The system includes a covering window layer spaced apart from the time of flight sensor layer, with an exit window and an entrance window, an emitting element in the time of flight sensor layer that transmits an emission signal, a receiving element in the time of flight sensor layer that receives a reception signal, one or more opaque walls, and light baffles incorporated into the one or more opaque walls. The one or more opaque walls extend at least a portion of the distance from the time of flight sensor layer to the covering window layer. The one or more opaque walls reduce the reflection backscatter of emission signals and reception signals. The light baffles in the one or more opaque walls reduce backscatter of emission signals and reception signals.

21 Claims, 19 Drawing Sheets

(56) References Cited

U.S. PATENT DOCUMENTS

| | | | |
|---|---|---|---|
| 2013/0153755 A1* | 6/2013 | Pikkujamsa | G01V 8/20 |
| | | | 250/221 |
| 2013/0242283 A1* | 9/2013 | Bailey | G01S 7/4813 |
| | | | 356/4.01 |
| 2014/0036361 A1* | 2/2014 | Woodgate | G02F 1/011 |
| | | | 359/466 |
| 2014/0103199 A1* | 4/2014 | Loong | G01S 7/493 |
| | | | 250/214.1 |
| 2015/0054103 A1* | 2/2015 | Mackey | H01L 27/14621 |
| | | | 257/432 |
| 2016/0238439 A1* | 8/2016 | Chu | H01L 31/02327 |
| 2016/0259056 A1* | 9/2016 | Heng | G01S 7/4813 |
| 2017/0090018 A1 | 3/2017 | Buettgen et al. | |
| 2017/0184450 A1* | 6/2017 | Doylend | G01S 7/4817 |
| 2018/0149751 A1* | 5/2018 | Geiger | G01S 7/4814 |
| 2020/0183013 A1* | 6/2020 | Iguchi | G01S 7/4813 |

* cited by examiner

TIME OF FLIGHT SENSOR WITH LIGHT BAFFLE SYSTEM AND METHOD

TECHNICAL FIELD

The present disclosure relates to a time of flight sensor, and more particularly to a time of flight sensor with a light baffle system.

BACKGROUND

Description of the Related Art

Machine-readable symbol readers, such as scanners (e.g., flying spot type) and imager-based machine-readable symbol readers, have become ubiquitous in today's environment. Such machine-readable symbol readers have been used to detect and capture one-dimensional machine-readable symbols (e.g., barcode symbols) and two-dimensional machine-readable symbols (e.g., matrix symbols, Quick Response code symbols, PDF417 symbols) that have been attached to, inscribed or otherwise physically associated with various physical objects.

Time of flight sensors are often employed in machine-readable symbol readers that employ distance to target (e.g., range) information to make the decoding more efficient. Typically, the machine-readable symbol reader adjusts the focus in autofocus systems based on the distance to target information. Time of flight sensors typically comprise one emitting diode (e.g., infrared LED) and one receiving photodiode. Since these time of flight sensors typically measure distances in the meter range, the emitted signal is very powerful and the receiving system is very sensitive. Since the time of flight sensor has to be protected from the external world, the sensor is typically covered by a transparent wall of glass or plastic. Unfortunately, this transparent wall of glass or plastic can induce cross talk between the emitting system and the receiving system, as shown in FIG. 1. The typical solution is to position the "exit window" for the signal very close to the TOF sensor (<1 mm). As a result, this "solution" creates a mechanical constraint that can be very limiting in the design of a machine-readable symbol reader.

Typically, a time of flight sensor has a working angle that may be wide, so that if the time of flight sensor is placed far from the exit surface of the machine-readable symbol reader, the surrounding mechanics can create spurious reflections. This tendency reduces the maximum working distance of the time of flight sensor, shown in FIG. 2.

Time of flight sensors are very sensitive to crosstalk induced by the covering window and by the surrounding mechanics of the machine-readable symbol reader. There is a continuing need in the art to reduce the crosstalk in these sensors and to give the designer of these systems more freedom for placing the exit window.

BRIEF SUMMARY

Briefly and in general terms, a time of flight sensor system having a time of flight sensor layer is disclosed. In one implementation of the time of flight sensor system, one or more opaque walls are incorporated that reduce reflection backscatter of emission signals and reception signals, insulate the emission and reception signals, and shape the emission signal angle and reception signal angle. The disclosed implementations of the time of flight sensor system provide technical solutions to the technical problems that result from the balancing of mechanical tolerance issues and system fragility against the positioning of a central wall and side walls in contact with a time of flight sensor layer and a covering window layer to reduce crosstalk and address dust particle issues.

At least one such implementation of the time of flight sensor system includes a covering window layer spaced apart from the time of flight sensor layer with an exit window and an entrance window, an emitting element in the time of flight sensor layer that transmits an emission signal, a receiving element in the time of flight sensor layer that receives a reception signal, one or more opaque walls, and light baffles incorporated into the one or more opaque walls. The one or more opaque walls extend at least a portion of the distance from the time of flight sensor layer to the covering window layer. The light baffles in the one or more opaque walls reduce backscatter of emission signals and reception signals.

In another implementation, the time of flight sensor system has a time of flight sensor layer, wherein emission signals travel away from the time of flight sensor layer and reception signals travel towards the time of flight sensor layer. The system includes a covering window layer spaced apart from the time of flight sensor layer, in which the covering window layer includes an exit window and an entrance window. The system also includes an emitting element in the time of flight sensor layer that transmits an emission signal towards the exit window in the covering window layer, and a receiving element in the time of flight sensor layer that receives a reception signal from the entrance window in the covering window layer. The time of flight sensor layer defines a central region between the emitting element and the receiving element, an outer emitter region adjacent to the emitting element and outwardly spaced from the central region, and an outer reception region adjacent to the receiving element and outwardly spaced from the central region. In another aspect, the system includes three opaque walls that include a central opaque wall, an outer emitter region wall, and an outer reception region wall. In some implementations, each of the three opaque walls is detached from the time of flight sensor layer, detached from the covering window layer, or detached from both the time of flight sensor layer and the covering window layer. Light baffles are incorporated into each of the three opaque walls that reduce backscatter of emission signals and reception signals.

In at least one aspect of the time of flight sensor system, the light baffles are protrusions from the one or more opaque walls towards an emission signal path that reduce the emission signal angle, or the light baffles are protrusions from the one or more opaque walls towards a reception signal path that reduce the reception signal angle. In such an implementation, a length of each protrusion is tangent to a line defining a working angle of the time of flight sensor. In another aspect of the time of flight sensor system, at least one detached end of the three opaque walls has enhanced, non-planar surfaces that reduce crosstalk. In still another aspect of the time of flight sensor system, a layer of signal absorbing material is secured to a covering window layer between the emitting element and the receiving element to tailor a working angle of the emission signal angle and the reception signal angle. In yet another aspect of the time of flight sensor system, an opaque material layer is positioned on an upper surface of the covering window layer in the outer reception region.

In some aspects of the time of flight sensor system, the one or more opaque walls comprise a first opaque wall that is incorporated on an upper surface of the covering window in the central region, and a second opaque wall that is incorporated on an upper surface of the covering window in the outer reception region. In some aspects of the time of flight sensor system, a first opaque material layer is incorporated on an upper surface of the covering window in the central region, and a second opaque material layer is incorporated on an upper surface of the covering window in the outer reception region.

In at least some aspects of the time of flight sensor system, the multiple opaque walls each have a bumper end that includes a bumper, and the multiple opaque walls each have the bumper end positioned proximate to the covering window layer. In another aspect of the time of flight sensor system, the multiple opaque walls each have a bumper end that includes a bumper, and the multiple opaque walls each have the bumper end positioned proximate to the time of flight sensor layer. In still another aspect of the time of flight sensor system, the multiple opaque walls have a first bumper end and a second bumper end that each include a bumper, the multiple opaque walls each having the first bumper end positioned proximate to the covering window layer and the second bumper end positioned proximate to the time of flight sensor layer.

In still another implementation, the time of flight sensor system includes a time of flight sensor layer and a covering window layer spaced apart from the time of flight sensor layer, the covering window layer including an exit window and an entrance window. The time of flight sensor system also includes an emitting element in the time of flight sensor layer that transmits an emission signal towards the exit window in the covering window layer, and a receiving element in the time of flight sensor layer that receives a reception signal from the entrance window in the covering window layer. In some implementations, the three opaque walls include a central opaque wall, an outer emitter region wall, and an outer reception region wall, wherein the central opaque wall has a detached end that is detached from the time of flight sensor layer, a detached end that is detached from the covering window layer, or two detached ends that are detached from both the time of flight sensor layer and the covering window layer.

Additionally, in at least one such implementation, at least one detached end has enhanced, non-planar surfaces that reduce crosstalk. Crosstalk is defined herein as signal reception at the receiving element from the emitting element due to unwanted reflection backscatter within the time of flight sensor system. In some implementations, the outer emitter region wall and the outer reception region wall each include at least at one bumper end having a bumper. The outer emitter region wall and the outer reception region walls each have (1) a bumper end positioned to be in contact with the covering window layer, (2) a bumper end positioned to be in contact with the time of flight sensor layer, or (3) a bumper end positioned to be in contact with the covering window layer and a bumper end positioned to be in contact with the time of flight sensor layer. The light baffles are incorporated into each of the three opaque walls that reduce backscatter of emission signals and reception signals.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements, as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with imagers and/or machine-readable symbol readers have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise. The headings and Abstract of the Disclosure provided herein are for convenience only and do not interpret the scope or meaning of the implementations.

Referring now to FIGS. 3-18C, in at least one implementation of the time of flight sensor system 100, the system incorporates light baffles between the optical elements of the sensor (i.e., the emitting element and the receiving element) and the transmissive covering window of a machine-readable symbol reader. Notably, this time of flight sensor system 100 provides the technological improvement of reducing the amount of internal optical cross-talk, as well as reducing the amount of optical cross-talk coming from outside the receiver. In this technical environment, cross-talk is defined as the unwanted transfer of signals between optical elements. Additionally, in some implementations of the time of flight sensor system 100, light baffles may be used to reduce the field of view. The following disclosure of various implementations of the time of flight sensor system 100 recites specific shapes and optical design parameters that have been used to produce technological improvements over traditional sensor systems.

Figure 1:
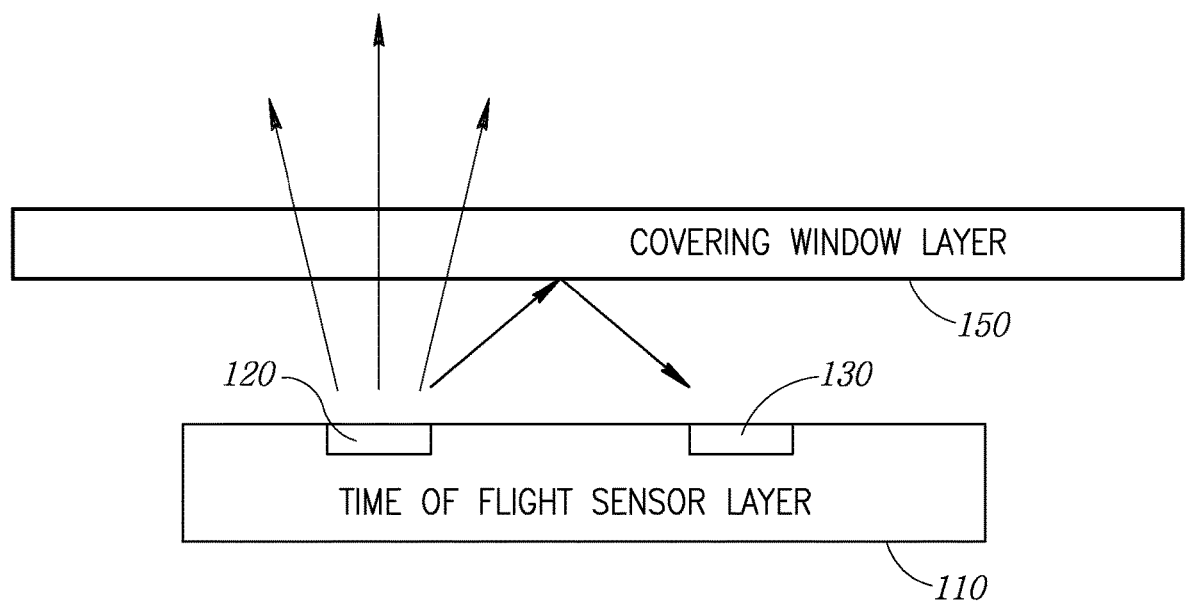
FIG. 1 is a side view of a traditional time of flight sensor with an emitter and a receiver in which the covering window creates crosstalk.
Figure 2:
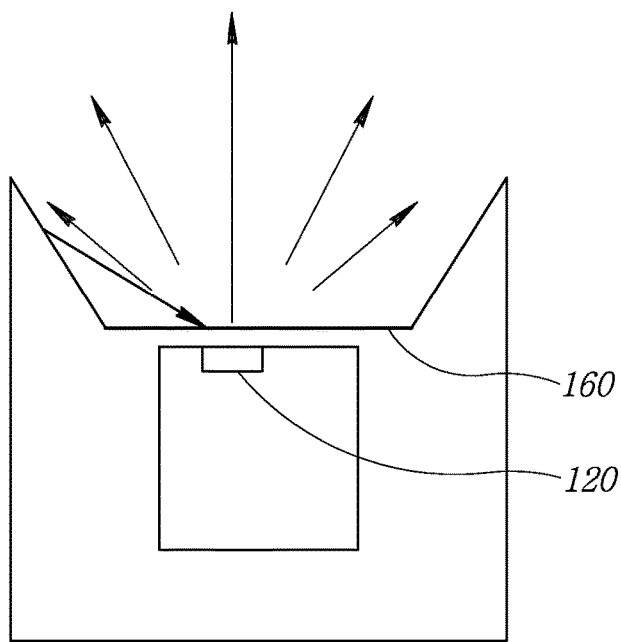
FIG. 2 is a side view of a traditional time of flight sensor in which rays are backscattered from the mechanics surrounding the time of flight sensor.
Figure 3:
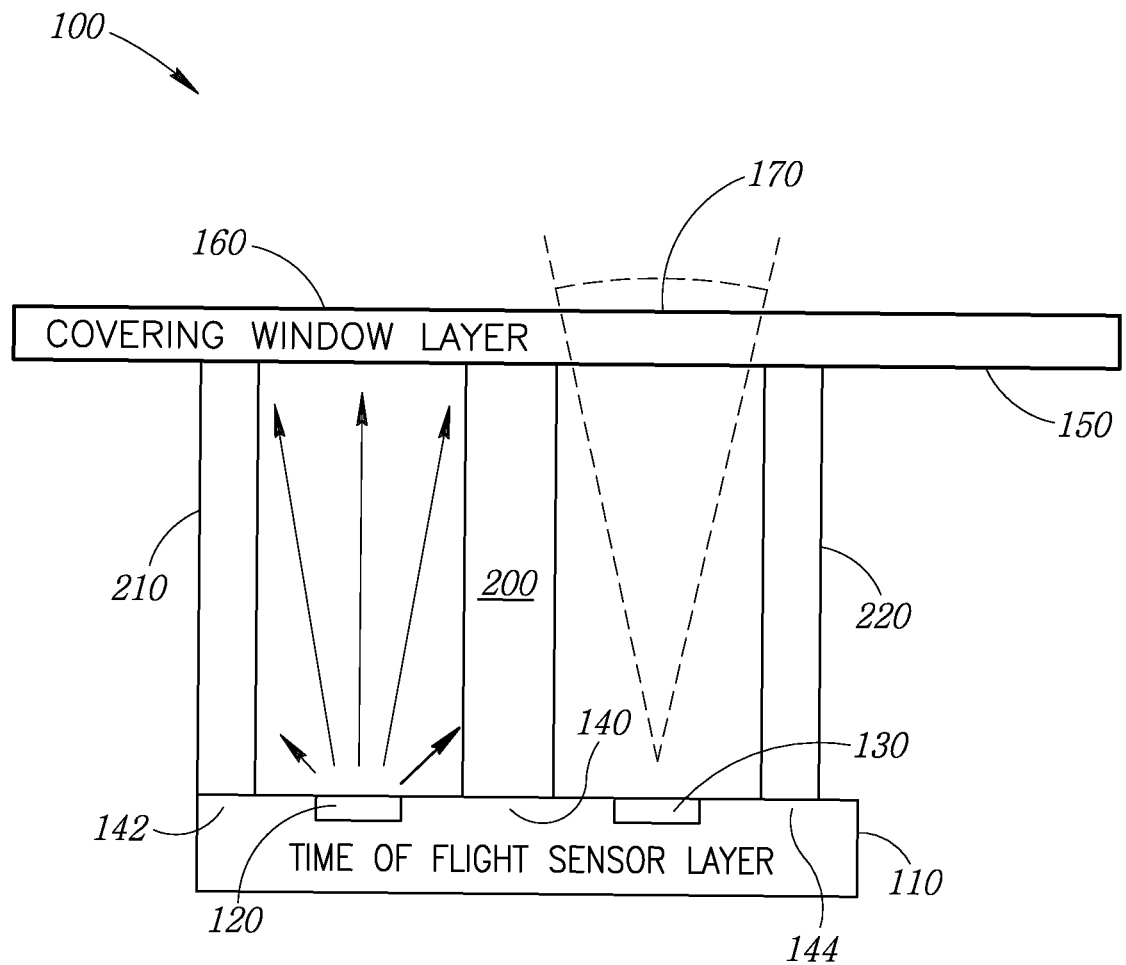
FIG. 3 is a side view of a time of flight sensor in which opaque walls are used to insulate emitting and receiving elements and to tailor the working angle and the covering window distance to the time of flight sensor, according to at least one illustrated implementation.

As shown in FIG. 3, in some implementations, the time of flight sensor system 100 has a time of flight sensor layer 110 and a covering window layer 150 spaced apart from the time of flight sensor layer. The time of flight sensor layer 110 includes an emitting element 120 that transmits emission signals, and a receiving element 130 that receives reception signals. The covering window layer 150 includes an exit window 160 and an entrance window 170 (see FIG. 6). Various implementations of the time of flight sensor system 100 include one or more opaque (i.e., signal absorbing) walls that extend perpendicularly between the time of flight sensor layer 110 and a covering window layer 150. In other implementations, other types of signal absorbing walls are utilized that are not opaque. Some implementations of the time of flight sensor system 100 include three separate opaque walls 200, 210, and 220 (see FIG. 3), while other implementations include only a single wall (see FIG. 7A). The one or more opaque walls reduce the reflection backscatter of the emission signals and the reception signals. In some implementations of the time of flight sensor system 100, the one or more opaque walls incorporate light baffles 140. The light baffles 140 in the one or more opaque walls are also used to reduce backscatter of the emission signals and the reception signals.

In at least one implementation, the time of flight sensor layer 110 defines a central region 140 between the emitting element 120 and the receiving element 130, an outer emitter region 142 adjacent to the emitting element 120 and outwardly spaced from the central region 140, and an outer reception region 144 adjacent to the receiving element 130 and outwardly spaced from the central region 140. In some implementations, the separate opaque walls include an opaque central wall 200 in the central region 140, an outer emitter region wall 210 in the outer emitter region 142, and an outer reception region wall 220 in the outer reception region 144. The three opaque walls 200, 210, and 220 are positioned and constructed in length to shape the emission signal angle and reception signal angle. Additionally, three opaque walls 200, 210, and 220 are positioned and constructed in length to insulate the emission signals and the reception signals. As such, the three opaque walls 200, 210, and 220 and the light baffles 140 appropriately shape the emission signal angle and reception signal angle of the emitting element 120 and receiving element 130, such that the time of flight sensor layer 110 may be placed far away from the exit window 160 in the covering window layer 150, which is desirable due to mechanical tolerance issues and construction limitations.

In some implementations of the time of flight sensor system 100, the three separate opaque walls 200, 210, and 220 are all positioned to make contact with (or are connected to) both the time of flight sensor layer 110 and the covering window layer 150. In other implementations of the time of flight sensor system 100, the three separate opaque walls 200, 210, and 220 are all positioned to make contact with (or are connected to) the time of flight sensor layer 110, but are not positioned to make contact with the covering window layer 150. In still other implementations of the time of flight sensor system 100, the three separate opaque walls 200, 210, and 220 are all positioned not to make contact with the time of flight sensor layer 110, but are positioned to make contact with (or are connected to) the covering window layer 150. In yet other implementations of the time of flight sensor system 100, the three separate opaque walls 200, 210, and 220 are positioned so that some of the walls make contact with the time of flight sensor layer 110, and are positioned so that some of the walls make contact with (or are connected to) the covering window layer 150.

Referring now to FIG. 3, is a side view of a time of flight sensor system 100 is shown in which three opaque walls 200, 210, and 220 are used to insulate the emitting element 120 and the receiving element 130, as well as to tailor the working angle of the time of flight sensor system 100. The three separate opaque walls include an opaque central wall 200 in the central region 140, an outer emitter region wall 210 in the outer emitter region 142, and an outer reception region wall 220 in the outer reception region 144. The opaque quality of the walls 200, 210, and 220 acts to reduce signal backscatter. Additionally, the dimensions of the opaque walls 200, 210, and 220 are selected to shape the signal emission angles and signal reception angles. In this regard, employing a longer length of the opaque walls 200, 210, and 220 results in smaller signal emission angles and signal reception angles 172 (i.e., reduces the field of view). Additionally, the exit window 160 in the covering window layer 150 may be placed farther away from the emitting element 120 and the receiving element 130 in the time of flight sensor layer 110, which insulates the emission and reception signals. Accordingly, the distance constraint is relaxed between the exit window 160 in the covering window layer 150 and the sensor elements in the time of flight sensor layer 110.

As described above, the opaque walls 200, 210, and 220 may have various structural configuration and implementations. In some implementations, as shown in FIG. 3, the opaque walls 200, 210, and 220 are attached to the time of flight sensor layer 110 and the covering window layer 150. In other implementations, at least one of the opaque walls 200, 210, and 220 (e.g., the opaque central wall 200 in FIGS. 4A and 4B) is detached from the time of flight sensor layer 110 and the covering window layer 150. Some implementations provide the technological improvement of increased tolerances for the mechanical assembly and reduction in optical crosstalk.

Figure 4A:
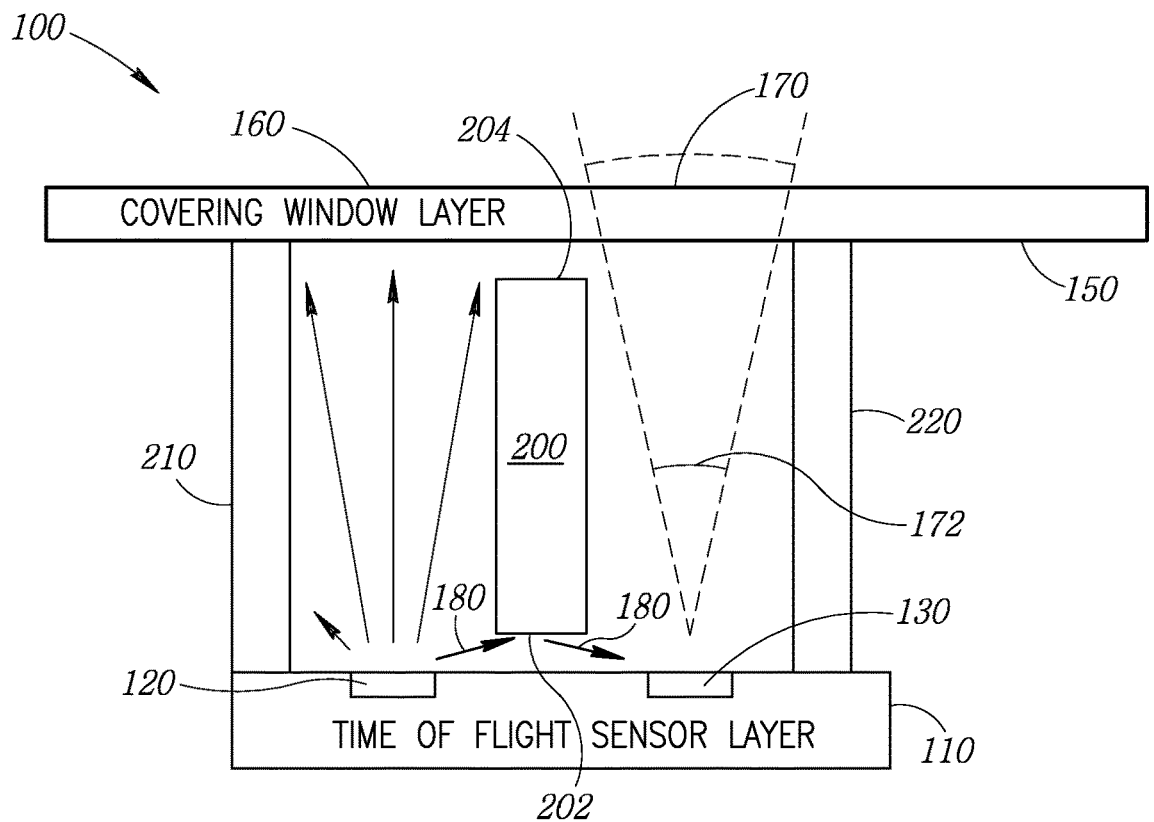
FIG. 4A is a side view of a time of flight sensor in which detached baffles provide mechanical tolerance, according to at least one illustrated implementation.

Referring now to FIG. 4A, a time of flight sensor system 100 is shown in which the opaque central wall 200 is detached from the time of flight sensor layer 110 and the covering window layer 150 to provide mechanical tolerance, while the outer emitter region wall 210 and the outer reception region wall 220 are attached to the time of flight sensor layer 110 and the covering window layer 150. The detached opaque central wall 200 has a sensor layer end 202 and a window layer end 204. In this implementation, the sensor layer end 202 and window layer end 204 each have a flat planar surface. The flat planar surfaces of the sensor layer end 202 and window layer end 204 allow for scattered signals that increase the crosstalk.

Figure 4B:
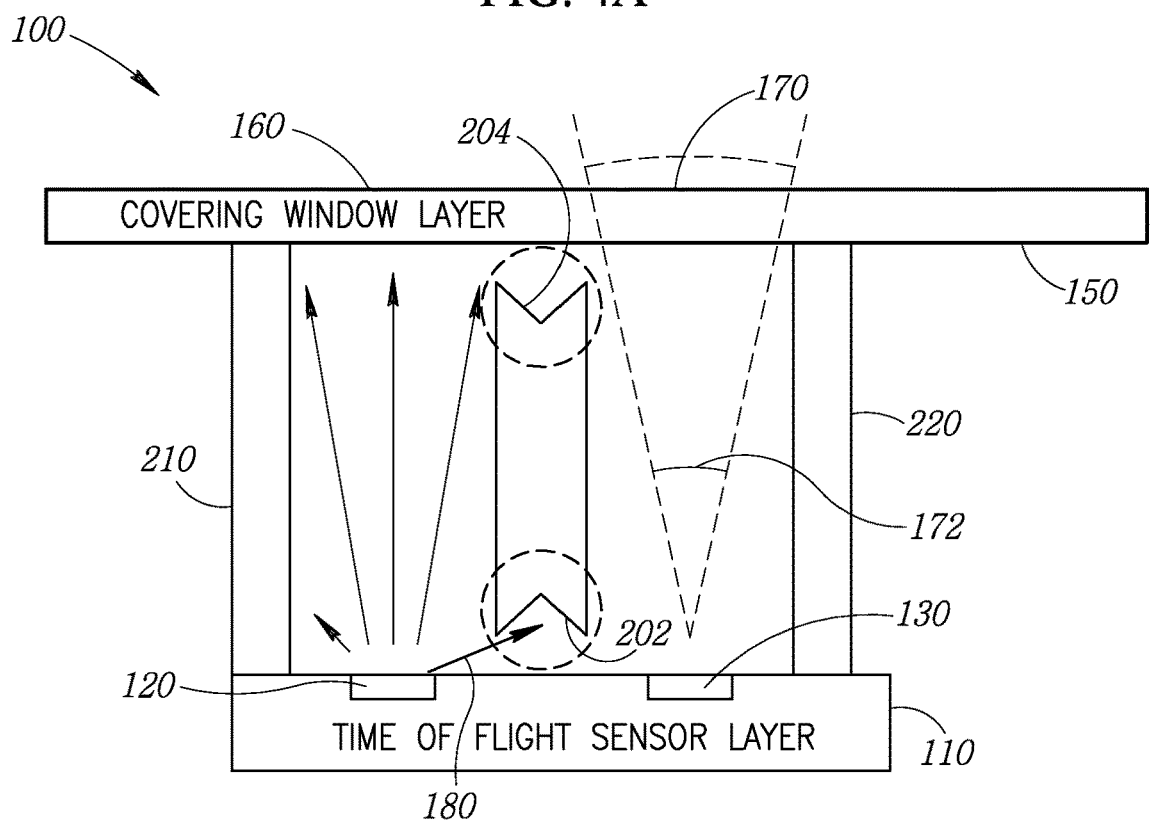
FIG. 4B is a side view of a time of flight sensor in which detached baffles with enhanced surfaces (i.e., crosstalk reducing geometry) reduce crosstalk and provide mechanical tolerance, according to at least one illustrated implementation.

Referring now to FIG. 4B, another time of flight sensor system 100 is shown in which the opaque central wall 200 is detached from the time of flight sensor layer 110 and the covering window layer 150 to provide mechanical tolerance, while the outer emitter region wall 210 and the outer reception region wall 220 are attached to the time of flight sensor layer 110 and the covering window layer 150. In this implementation, the sensor layer end 202 and the window layer end 204 of the detached opaque central wall 200 each have enhanced (non-planar) surface geometry. The enhanced (non-planar) surface geometry prevents (or at least reduces) crosstalk due to its geometry that impedes signal reflections. In the implementation shown in FIG. 4B, the sensor layer end 202 and the window layer end 204 each have a single right angled indentation in the surface. However, in other implementations, larger numbers of right angled indentations in the surface are incorporated. In still other implementations, larger numbers of angled indentations and other degrees of angled indentations in the surface are incorporated.

Figure 5A:
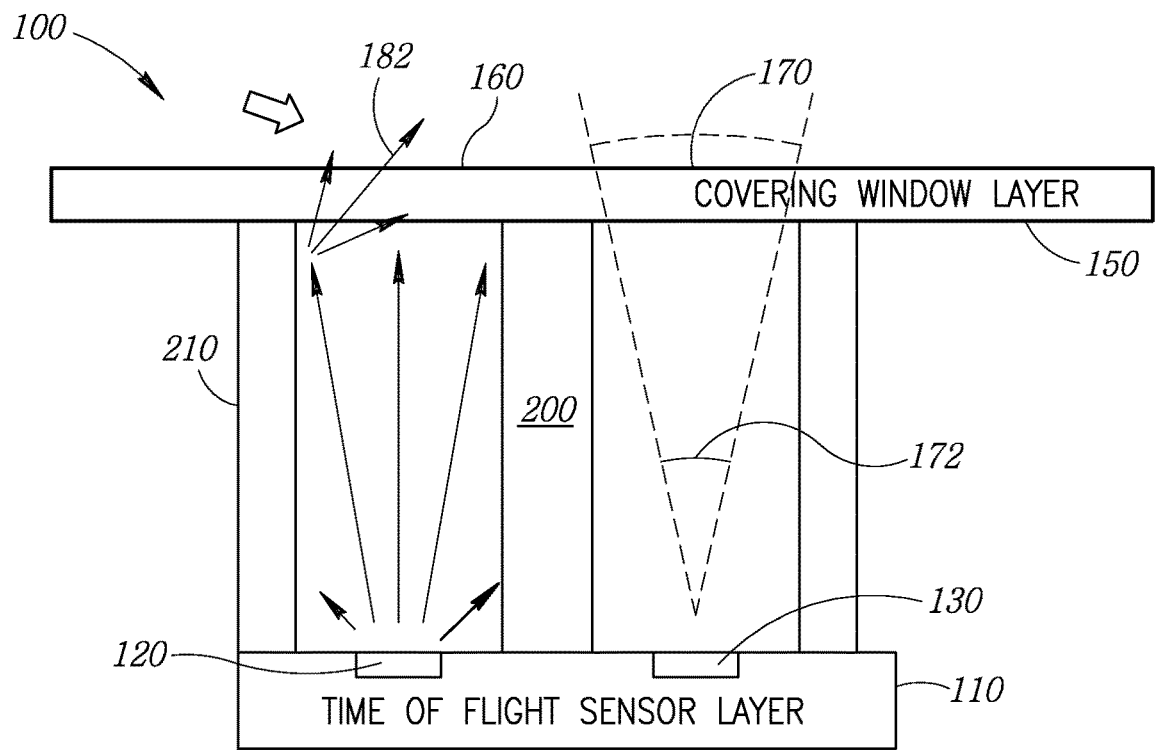
FIG. 5A is a side view of a time of flight sensor in which opaque side walls are smooth, thus causing scattered rays that increase the working angle, according to at least one illustrated implementation.

Referring now to FIG. 5A, a time of flight sensor system 100 is shown with an opaque central wall 200 in the central region 140, an outer emitter region wall 210 in the outer emitter region 142, and an outer reception region wall 220 in the outer reception region 144. In this implementation, the walls 200, 210, and 220 are smooth, which allow for reflected and/or scattered signals 182 that undesirably increase the working angle of the time of flight sensor system 100.

Figure 5B:
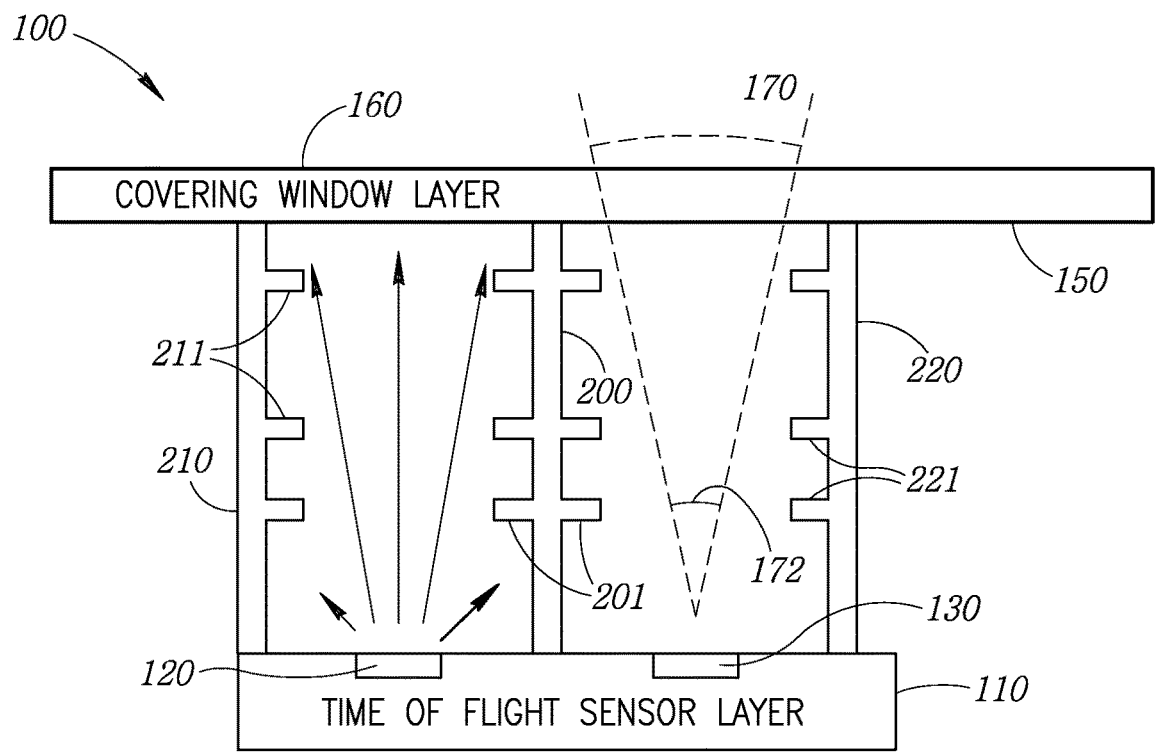
FIG. 5B is a side view of a time of flight sensor in which opaque side walls incorporate baffles (or the walls are otherwise textured or rough) that prevent scattered rays, and thus reduce the working angle, according to at least one illustrated implementation.

Conversely, FIG. 5B displays a time of flight sensor system 100 in which the opaque side walls 200, 210, and 220 incorporate light baffles 201, 211, 221 that prevent (or at least reduce) reflected and/or scattered signals, thus reducing the working angle of the time of flight sensor system 100. In this implementation, the opaque central wall 200 in the central region 140 has light baffles 201 on both side of the opaque central wall 200, an outer emitter region wall 210 has light baffles 211 on the inwardly facing side of the wall 210, and an outer reception region wall 220 in the outer reception region 144 has light baffles 221 on the inwardly facing side of the wall 220.

Figure 6:
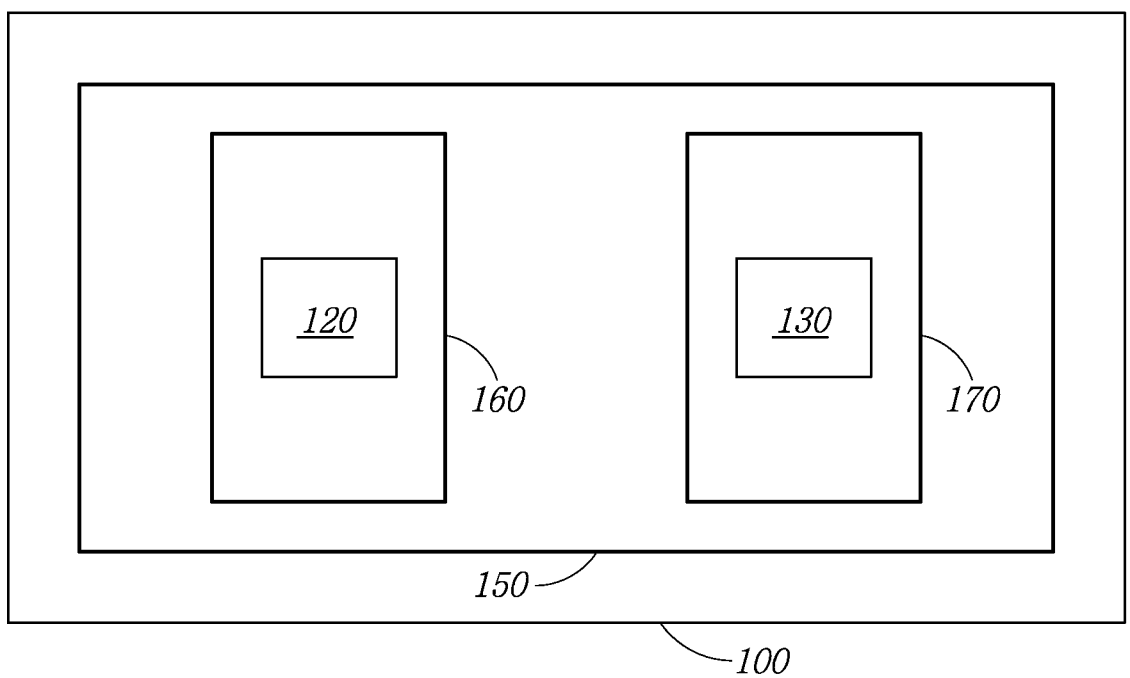
FIG. 6 is a top view of baffles with rectangular sections for the emitting element and the receiving element, according to at least one illustrated implementation.

Referring now to another aspect of the time of flight sensor system 100, in some implementations, one dimension of the sensor system (e.g., width or length) is less critical in its assembly. In such implementations, the exit window 160 and the entrance window 170 may be constructed to be rectangular (rather than a square or circular shape) to allow for more centering tolerance. In this regard, FIG. 6 is a top view of the covering window layer 150 of the time of flight sensor system 100, showings the exit window 160 and the entrance window 170 with rectangular sections for the emitting element 120 and the receiving element 130.

In various implementations of the time of flight sensor system 100, variations in the light baffles and the number of walls extending between the time of flight sensor layer 110 and the covering window layer 150 depend on the desired attributes of the time of flight sensor system 100. In at least one implementation shown in FIG. 7A, a side view of a time of flight sensor system 100 is shown in which an opaque central wall 200 is incorporated between an emitting element 120 and a receiving element 130 to reduce optical crosstalk. In another implementation, time of flight sensor system 100 has an opaque central wall 200 incorporated between an emitting element 120 and a receiving element 130 that is detached from the covering window layer 150. In still another implementation shown in FIG. 7B, a side view of a time of flight sensor system 100 is shown in which a nonreflecting layer 230 is incorporated below the covering window (between an emitting element 120 and a receiving element 130) to reduce optical crosstalk.

Figure 7A:
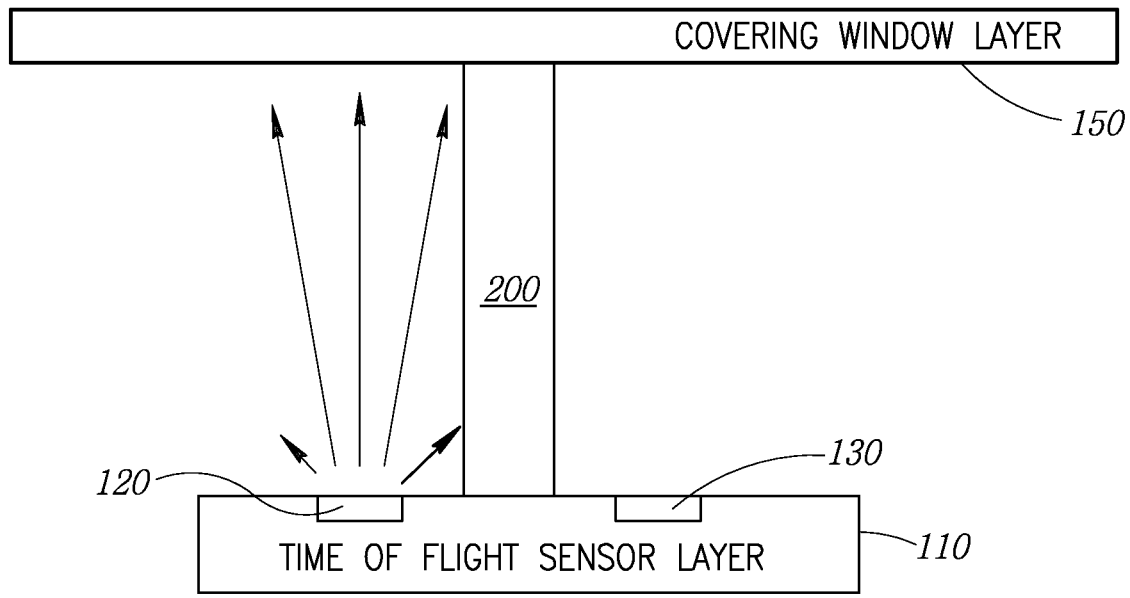
FIG. 7A is a side view of a time of flight sensor in which a single opaque wall is incorporated between an emitting element and a receiving element, according to at least one illustrated implementation.
Figure 7B:
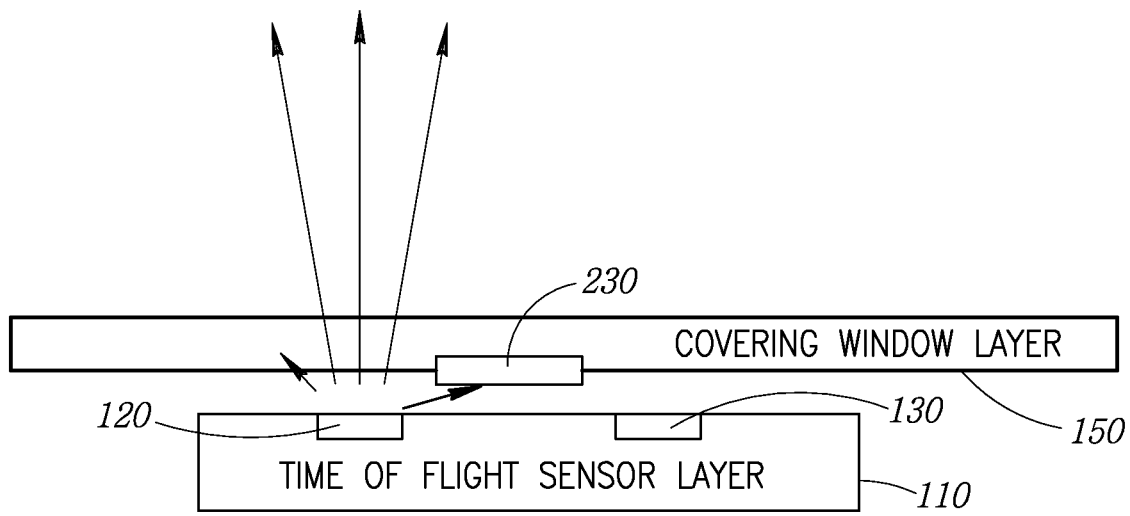
FIG. 7B is a side view of a time of flight sensor with an absorbing layer on the covering window between an emitting element and a receiving element, according to at least one illustrated implementation.
Figure 7C:
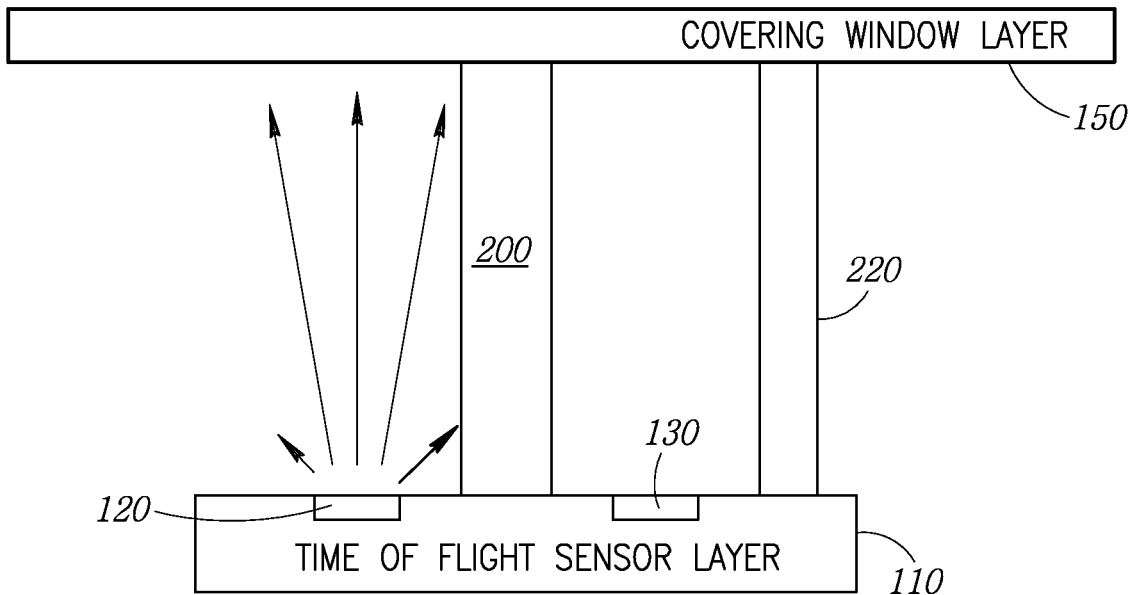
FIG. 7C is a side view of a time of flight sensor in which a first opaque wall is incorporated between an emitting element and a receiving element, and a second opaque wall is incorporated on the other side of the receiving element, according to at least one illustrated implementation.

Referring now to FIG. 7C, a side view of a time of flight sensor system 100 is shown in which an opaque central wall 200 is incorporated between an emitting element 120 and a receiving element 130 to reduce optical crosstalk, and an outer reception region wall 220 is incorporated in the outer reception region 144 for field of view clipping. The reduction on the field of view is useful to avoid signal back reflections from nearby objects. This action is sometimes referred to as spatial filtering.

Figure 8A:
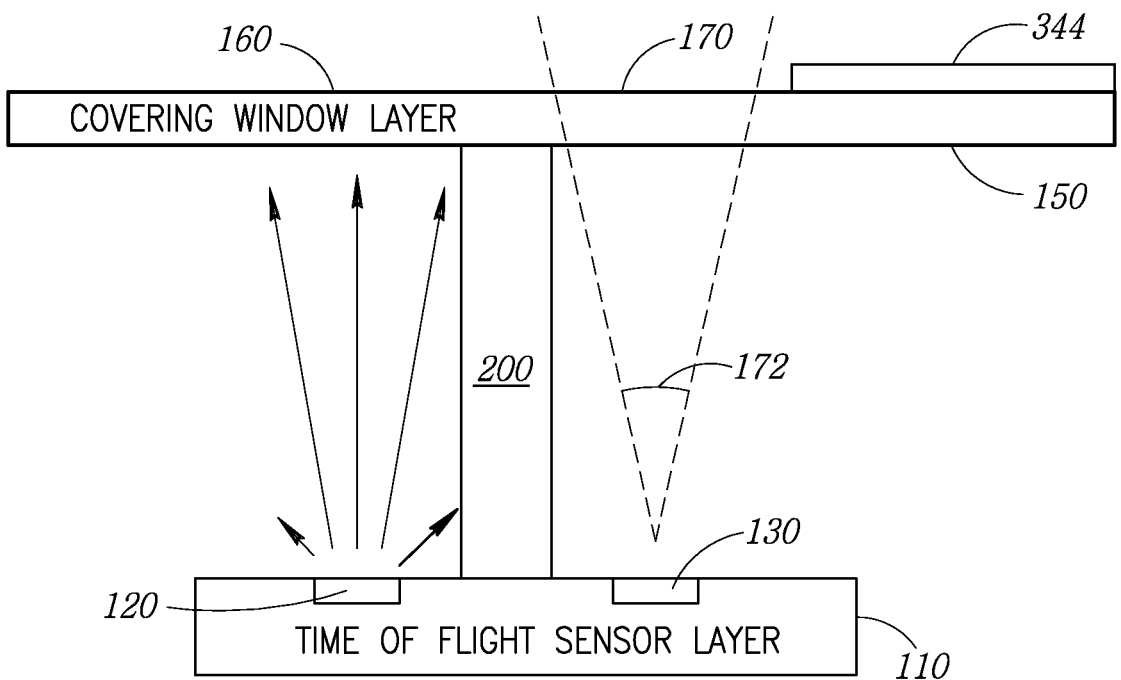
FIG. 8A is a side view of a time of flight sensor in which a single opaque wall is incorporated between an emitting element and a receiving element, and an opaque layer has been added to the upper surface of the covering window, according to at least one illustrated implementation.

Referring now to FIG. 8A, a side view of another time of flight sensor system 100 is shown in which an opaque central wall 200 is incorporated between an emitting element 120 and a receiving element 130 to reduce optical crosstalk. In this implementation, the outer reception region wall 220 is removed (from the implementation of FIG. 7C) and replaced with a signal absorbing layer 344 on the upper surface of the covering window layer 150. The signal absorbing layer 344 on the upper surface of the covering window layer 150 is positioned above the outer reception region 144. The signal absorbing layer 344 on the upper surface of the covering window layer 150 is useful for field of view clipping. Again, the reduction on the field of view is useful to avoid signal back reflections from nearby objects.

Figure 8B:
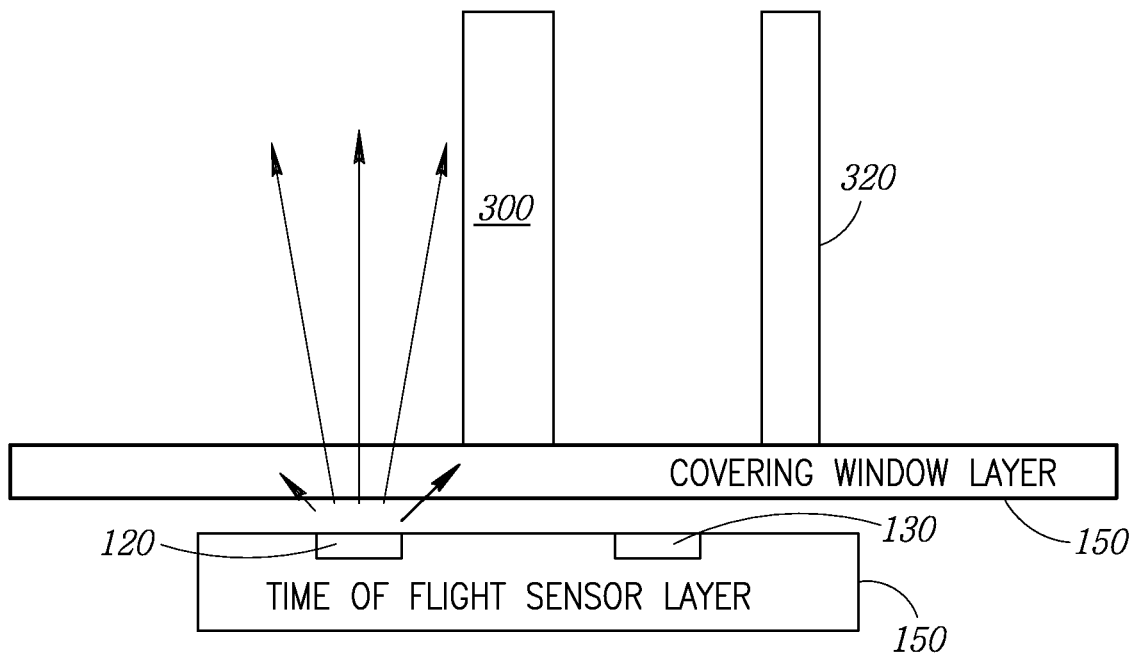
FIG. 8B is a side view of a time of flight sensor in which a first opaque wall is incorporated (beyond the covering window) between an emitting element and a receiving element, and a second opaque wall is incorporated (beyond the covering window) on the other side of the receiving element, according to at least one illustrated implementation.

FIG. 8B shows an implementation of a time of flight sensor system 100 in which an upper central wall 300 is incorporated on the upper surface of the covering window layer 150 between the emitting element 120 and the receiving element 130. Additionally, in this implementation, an upper outer reception wall 320 is incorporated on the upper surface of the covering window layer 150 above the outer reception region 144. The field of view reduction is achieved by this implementation as well.

Figure 8C:
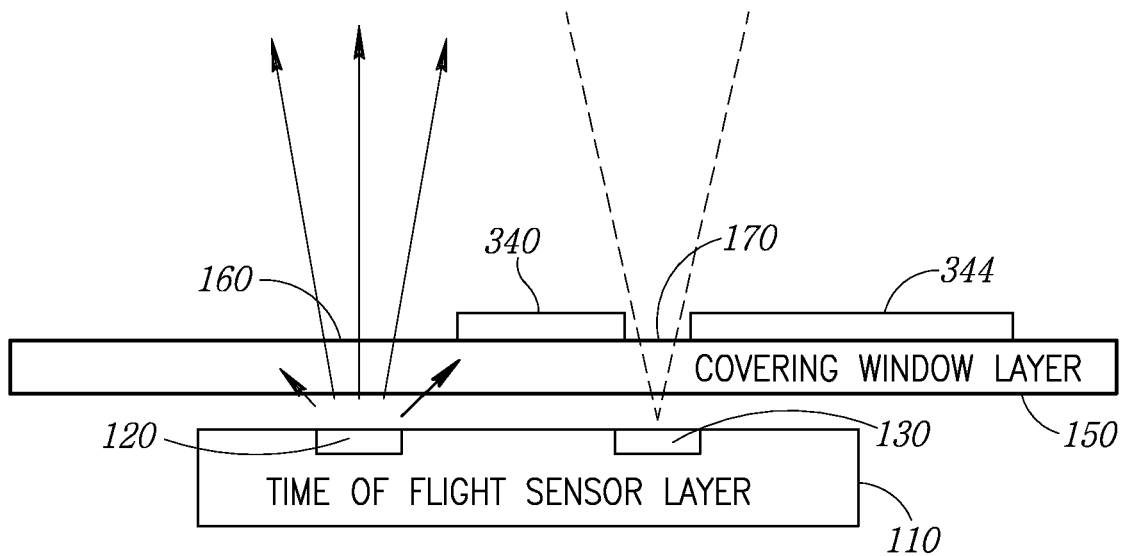
FIG. 8C is a side view of a time of flight sensor in which a first opaque layer is added to the upper surface of the covering window (beyond the covering window) between an emitting element and a receiving element, and a second opaque layer is added to the upper surface of the covering window (beyond the covering window) on the other side of the receiving element, according to at least one illustrated implementation.

Referring now to FIG. 8C, a side view of another time of flight sensor system 100 is shown in which the upper central wall 300 and the upper outer reception wall 320 are removed (from the implementation of FIG. 8B) and replaced with signal absorbing layers on the upper surface of the covering window layer 150. The upper center absorbing layer 340 is added to the upper surface of the covering window layer 150 above the central region 140. The upper outer reception absorbing layer 344 is added to the upper surface of the covering window layer 150 above the outer reception region 144.

The field of view reduction may be employed on one of the emitting element 120 or the receiving element 130, or on both of the emitting element 120 and the receiving element 130. If field of view reduction is employed on only one of the emitting element 120 or the receiving element 130, it is preferable to select the receiving element 130, since this reduces the out-of-field of view noise coming from the ambient environment. Therefore, this configuration improves the overall Signal-to-Noise ratio.

Figure 9A:
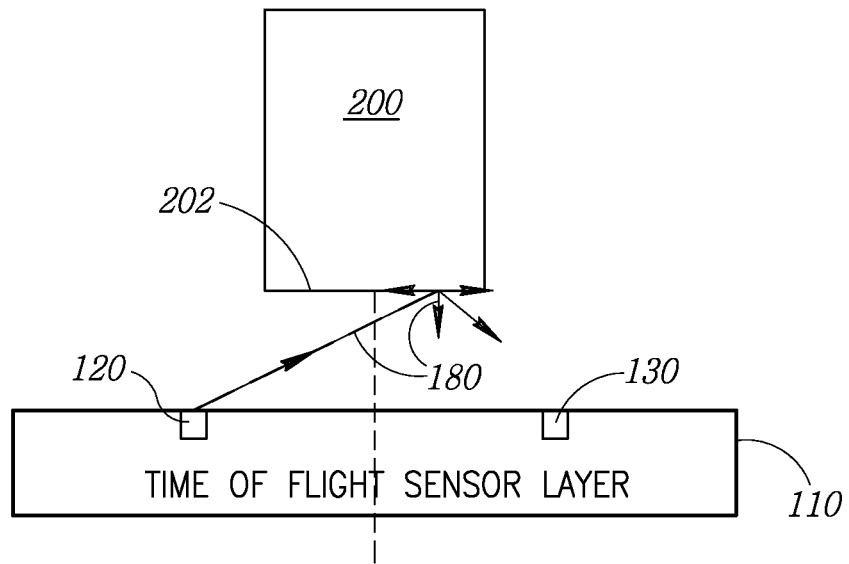
FIG. 9A is a side view of a time of flight sensor in which a detached absorbing wall provides mechanical tolerance, according to at least one illustrated implementation.

In some implementations, the mechanical constraints of the time of flight sensor system 100 prevent the separating opaque walls 200, 210, and 220 from being attached to the time of flight sensor layer 110. As shown in FIG. 9A, a time of flight sensor system 100 with an opaque central wall 200 that is detached from the time of flight sensor layer 110 has a horizontal sensor layer end 202 that can contribute to cross-talk from reflected signals 180. This is an undesirable configuration.

Figure 9B:
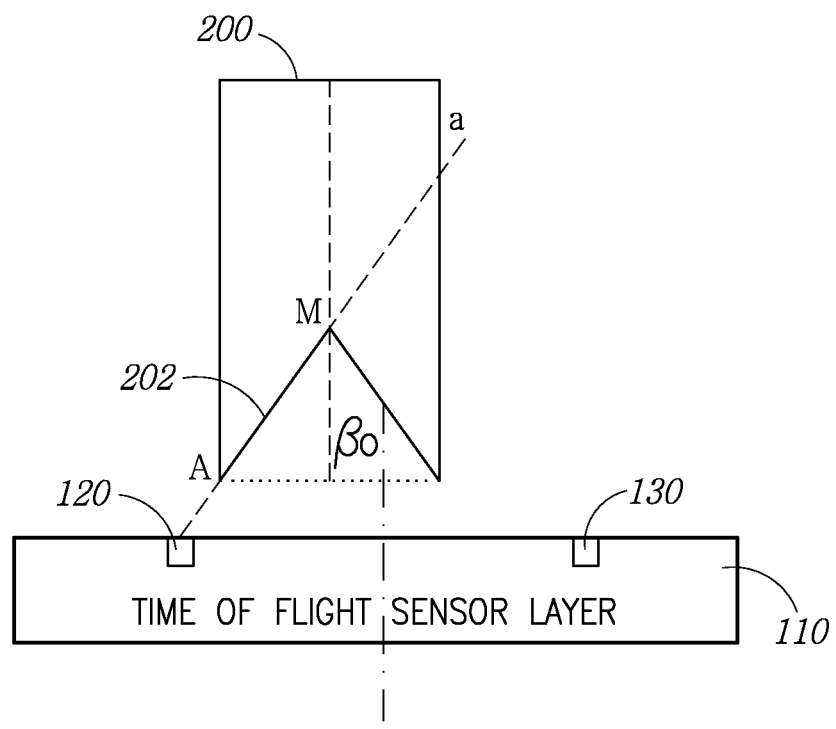
FIG. 9B is a side view of a time of flight sensor in which a detached absorbing wall with enhanced surfaces (i.e., crosstalk reducing geometry) reduces crosstalk and provides mechanical tolerance, according to at least one illustrated implementation.

Referring now to FIG. 9B, an improved time of flight sensor system 100 is shown with an opaque central wall 200 that is detached from the time of flight sensor layer 110. The detached opaque central wall 200 has a sensor layer end 202 that incorporates enhanced (non-planar) surface geometry to minimize signal scattering. The enhanced (non-planar) surface geometry prevents (or at least reduces) crosstalk due to its geometry that impedes signal reflections.

In at least one implementation, the profile of the sensor layer end 202 of the detached opaque central wall 200 is determined using the following procedure. The opaque central wall 200 is placed at the maximum distance from the time of flight sensor layer 110 and at the maximum lateral offset as given by the tolerances of the mechanical structure. This is the worst case scenario for crosstalk due to scattered rays.

Referring still to FIG. 9B, in this scenario, line "a" is drawn from the emitting element 120 that passes through the edge A of the detached opaque central wall 200. The detached opaque central wall 200 is cut by line "a" up to the middle point "M." The inverted "V" profile having the angle $\beta_0$ is obtained using a symmetric cut. The angle of the "V" profile actually used is $\beta < \beta_0$ so that not even rays grazing the inner surfaces can reach the receiving element 130. Accordingly, $\beta$ has a sharper (more acute) "V" profile by shifting the point "M" upwards into the detached opaque central wall 200 and farther from the time of flight sensor layer 110. In some implementations, the nominal size and position of the detached opaque central wall 200 is optimized so that no reflected ray may pass from the emitting element 120 to the receiving element 130.

Figure 10:
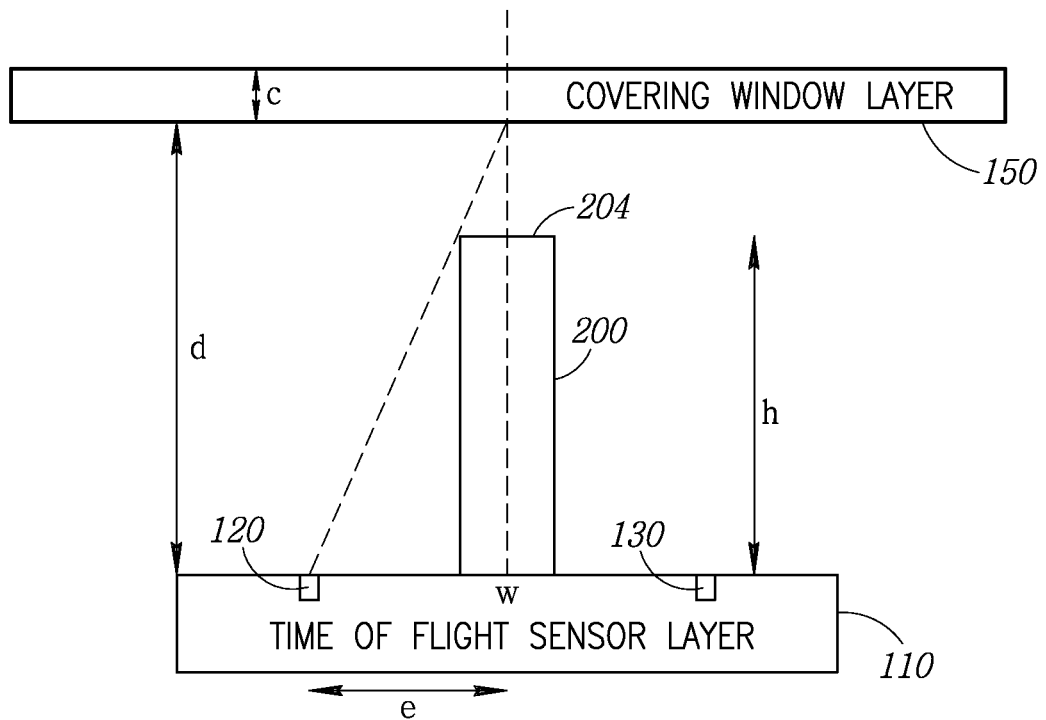
FIG. 10 is a side view of a time of flight sensor in which a single vertical wall is positioned halfway from emitting and receiving elements, and constructed in height for crosstalk reduction, according to at least one illustrated implementation.

In at least one implementation that is shown in FIG. 10, an opaque central wall 200 is placed halfway between the emitting element 120 and the receiving element 130 for crosstalk reduction. To avoid direct reflection from the lower surface of the covering window layer 150:

$$\frac{d-h}{w/2} > \frac{d}{e}$$

where "d" is the distance from the covering window layer 150 to the time of flight sensor layer 110, "h" is the height of the opaque central wall 200, "w" is the width of the opaque central wall 200, "e" is the distance of the emitting element 120 from the symmetry plane.

Figure 11A:
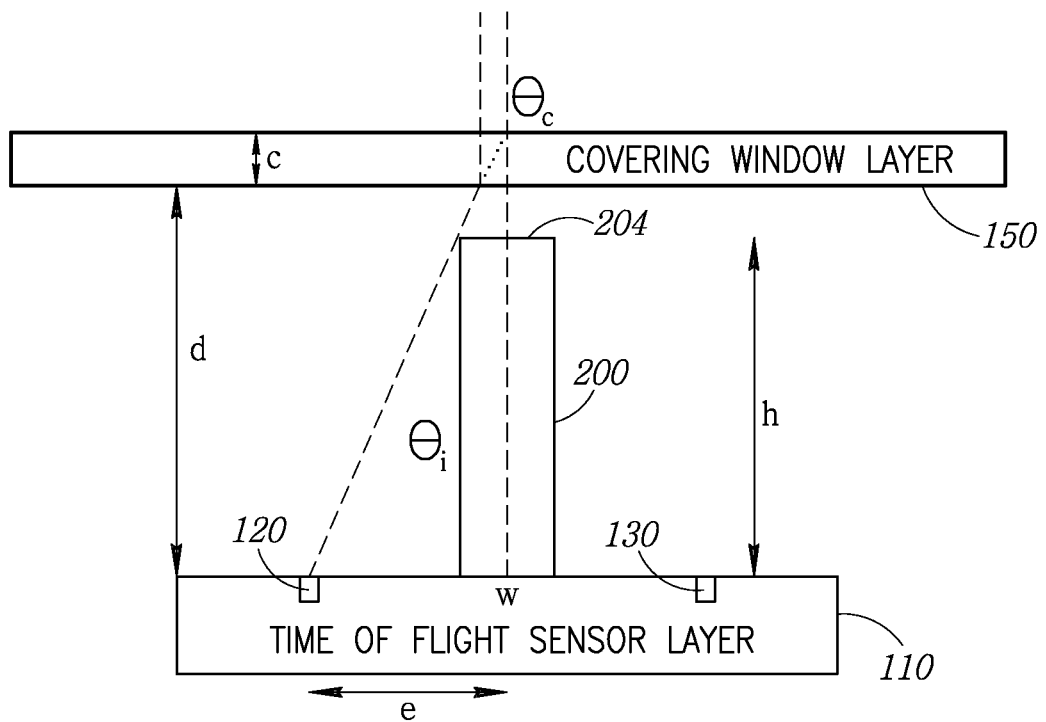
FIG. 11A is a side view of a time of flight sensor in which a single vertical wall is positioned halfway from emitting and receiving elements, and sized in height for crosstalk reduction, according to at least one illustrated implementation.
Figure 11B:
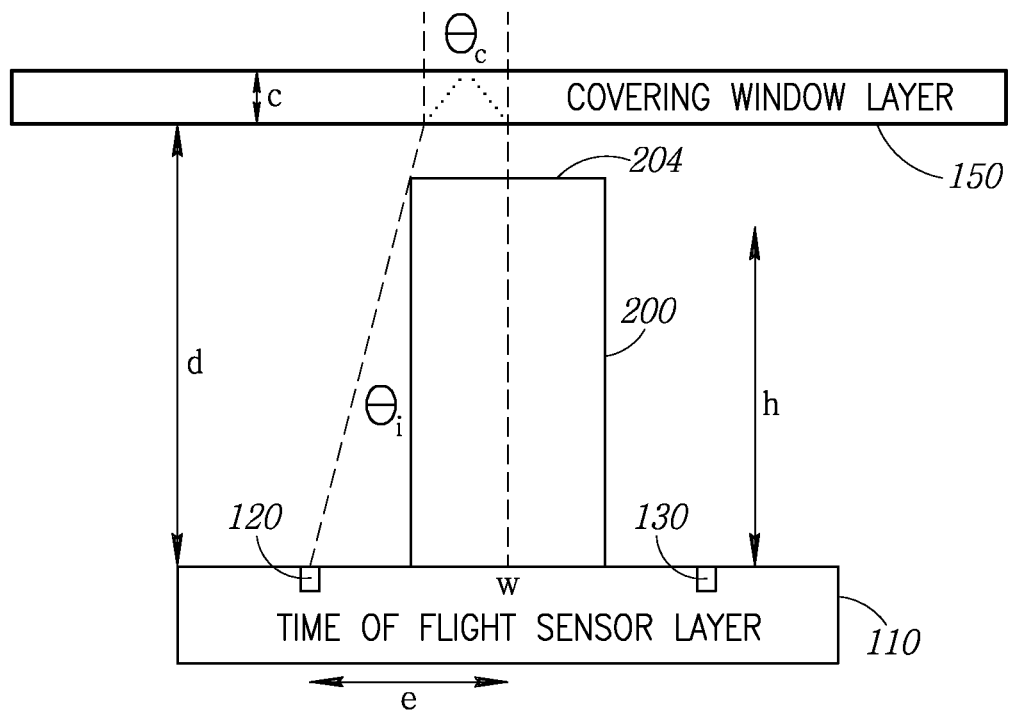
FIG. 11B is a side view of a time of flight sensor in which a single vertical wall is positioned halfway from emitting and receiving elements, and sized in width for crosstalk reduction, according to at least one illustrated implementation.

Referring now to FIGS. 11A and 11B, in order to avoid direct reflection from the upper layer of the covering window layer 150:

$$c \tan \theta_c < w/2$$

where:

$$\sin \theta_i = n_c \sin \theta_c \text{ and } \tan \theta_i = \frac{h}{e - 0.5w} \text{ and } \theta_i$$

is the incidence angle of the limit ray to the covering window layer 150, and $\theta_c$ is the refraction angle of that ray in the window.

In order to avoid three reflections inside the window:

$$2c \tan \theta_c < w/2.$$

Figure 11C:
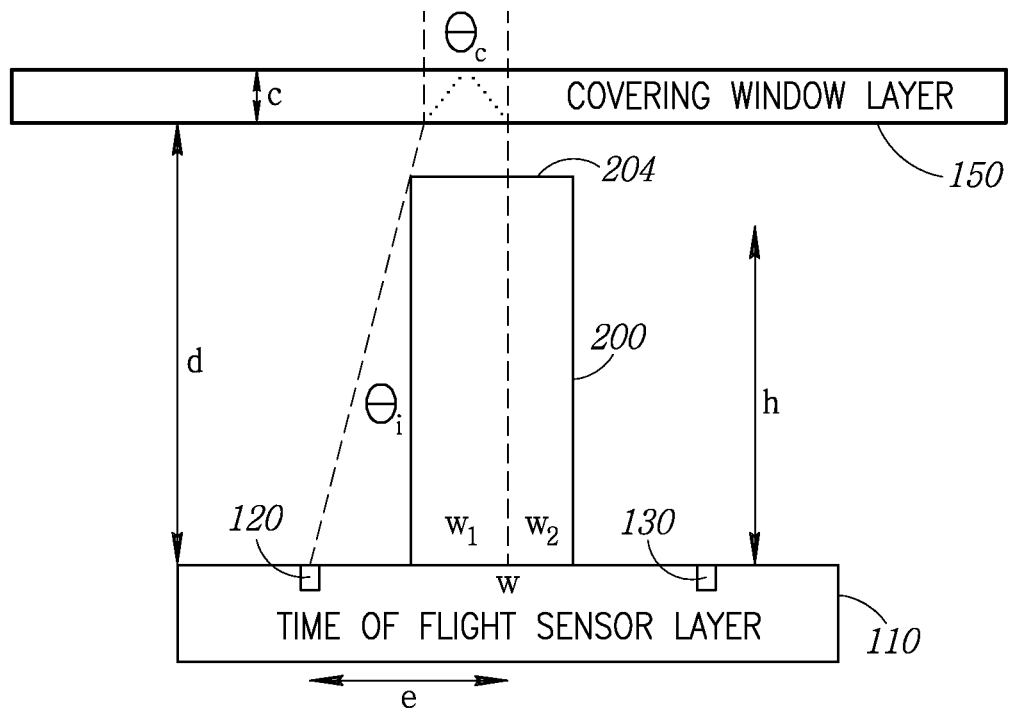
FIG. 11C is a side view of a time of flight sensor in which a single vertical wall is positioned halfway from emitting and receiving elements, and positioned in asymmetry for crosstalk reduction, according to at least one illustrated implementation.

Referring now to FIG. 11C, these formulas can be extended to the case of an asymmetric design considering two halves made by the plane of symmetry given by the emitting element 120 and the receiving element 130. Therefore the width of the opaque central wall 200 is given by w=w1+w2. In such a scenario, the configuration is made by solving the previous equations on each side (i.e., the emitting side and the receiving side) separately.

Figure 12A:
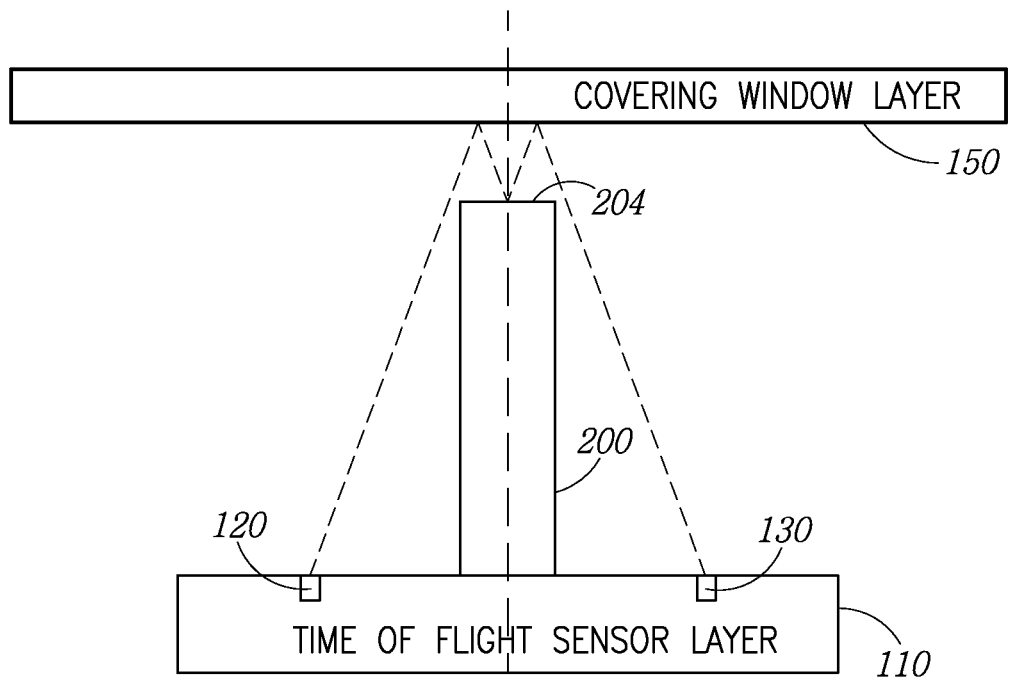
FIG. 12A is a side view of a time of flight sensor in which an absorbing wall is detached from the covering window to provide mechanical tolerance, according to at least one illustrated implementation.

In at least one implementation of the time of flight sensor system 100 shown in FIG. 12A, the opaque central wall 200 is detached from the covering window layer 150 and has an exposed window layer end 204. In such an implementation, the scattered/reflected rays from the horizontal window layer end 204 of the opaque central wall 200 can contribute to the crosstalk. This is an undesirable configuration.

Figure 12B:
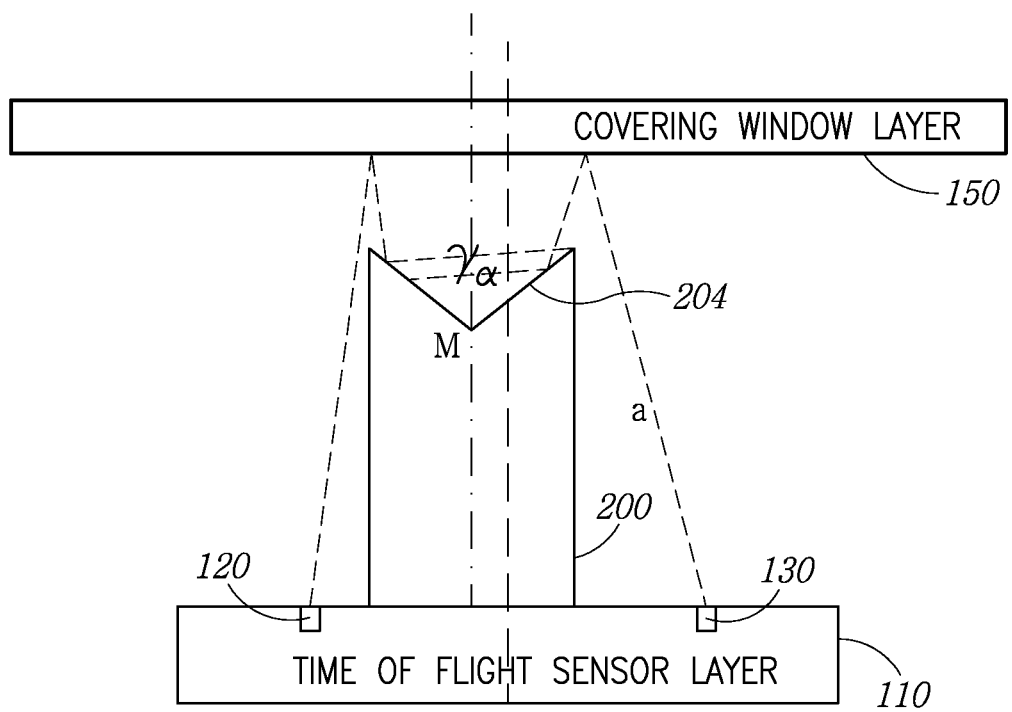
FIG. 12B is a side view of a time of flight sensor in which an absorbing wall that is detached from the covering window has enhanced surfaces (i.e., crosstalk reducing geometry) to reduce crosstalk and provide mechanical tolerance, according to at least one illustrated implementation.

Accordingly, the surface of the exposed window layer end 204 can be modified to reduce the crosstalk, as shown in FIG. 12B. In this implementation, the opaque central wall 200 is in its most shifted position and the covering window at its maximum distance due to tolerances. Continuing, the rays are traced to connect the emitting element 120 and the receiving element 130 to the edges of the opaque central wall 200 and the middle point "M" is pulled downwards (thus reducing the V angle γ) until both reflected signals are further intercepted by the opaque central wall 200 itself. This configuration is designed to intercept the signals reflected from the opaque central wall 200. If the scattered signals still contribute to cross talk, the angle γ can be further reduced until the scattered signals with the smallest angle are further intercepted by the wall.

Figure 13:
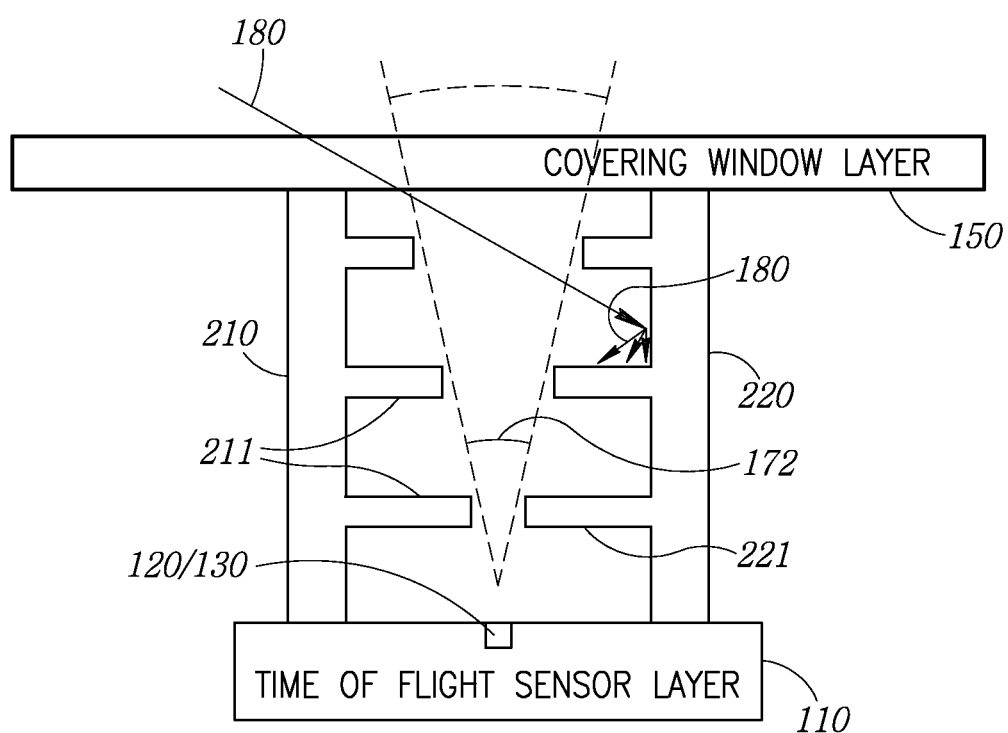
FIG. 13 is a side view of a time of flight sensor in which opaque side walls incorporate internal protrusions on the baffle tube that prevent scattered rays, wherein the length of each protrusion is tangent to the lines defining the working angle of the time of flight sensor, according to at least one illustrated implementation.

Referring now to FIG. 13, a side view of a time of flight sensor system 100 is shown in which opaque side walls 210, 220 incorporate internal protrusions 211, 221 on the baffle tube that prevent scattered signals. In case scattering from the inner surfaces of the opaque wall is relevant, internal protrusions can be added to the baffle tube. The length of each protrusion 211, 221 is tangent to the lines defining the working angle of the time of flight sensor system 100. As shown in FIG. 13, a signal 180, which is out of the working angle 172, creates scattered signals 180 that are blocked by the internal protrusions 211, 221.

Figure 14A:
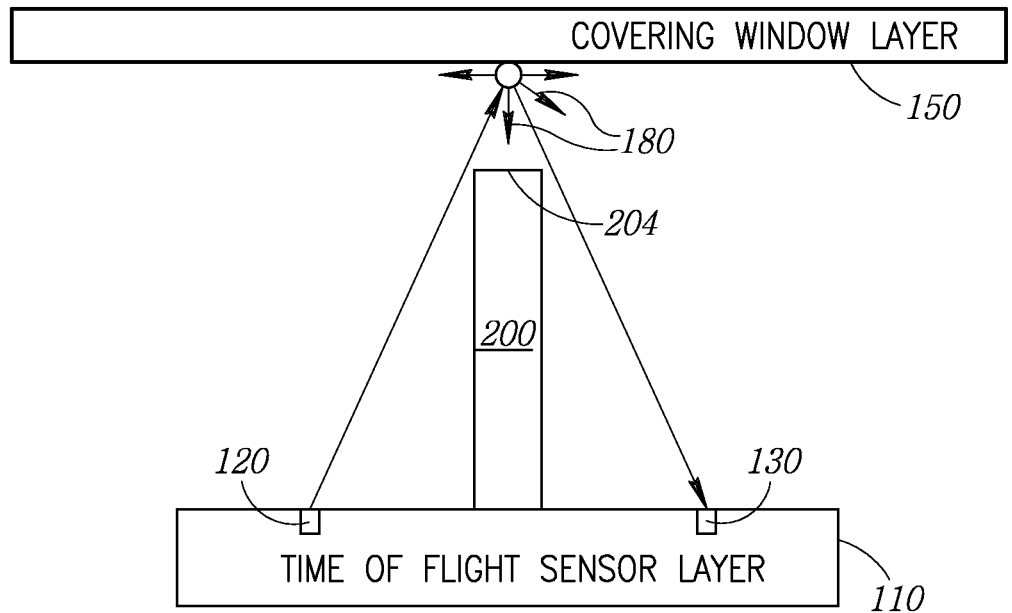
FIG. 14A is a side view of a time of flight sensor in which a single vertical wall is positioned between emitting and receiving elements, and backscattering occurs due to dust particles on the covering window, according to at least one illustrated implementation.
Figure 14B:
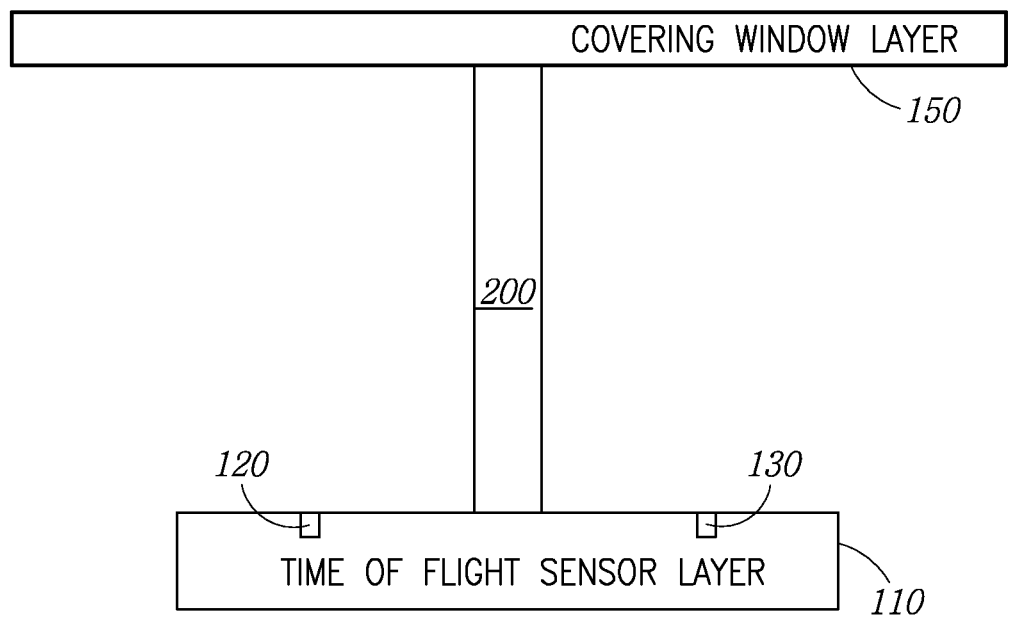
FIG. 14B is a side view of a time of flight sensor in which a single vertical wall is positioned between emitting and receiving elements, and no backscattering occurs due to dust particles on the covering window since the single vertical wall contacts the covering window, according to at least one illustrated implementation.

As has been discussed above, traditional time of flight sensors are very sensitive to crosstalk. As shown in FIG. 14A, any imperfection of the glass in the exit window 160 of the covering window layer 150 or dust particle on the covering window layer 150 can cause signal backscattering 180 and increase the crosstalk. As shown in FIG. 14B, if an opaque central wall 200 separates the emitting element 120 and the receiving element 130 is incorporated, this effect is greatly reduced. The closer the opaque central wall 200 is to the covering window layer 150 and the larger the size of the opaque central wall 200, the smaller the chance that dust particles can cause signal backscattering. Notably, the formulas discussed above regarding the distance and width of the opaque central wall 200 with respect to one and three ray reflections at the covering window layer 150 may also be implemented with respect to dust particles. The only difference is that the signal backscatter is not generated by window reflections, but is instead due to dust particles that can be inside or outside the covering window layer 150.

For improved performance, the opaque central wall 200 is positioned in contact with the covering window layer 150, since the opaque central wall 200 blocks dust particles inside the window. However, positioning the opaque central wall 200 in contact with the covering window layer 150 makes the system fragile with respect to shocks. In this manner, if a device in which the time of flight sensor system 100 is embedded is dropped on the floor by a user, then the movement of the opaque central wall 200 relative to the covering window layer 150 can trigger breakage of the window itself. Similarly, the movement of the opaque central wall 200 relative to the time of flight sensor layer 110 can trigger breakage of the time of flight sensor elements.

To avoid this issue of system fragility and maintain the opaque central wall 200 in contact with the time of flight sensor layer 110, the opaque central wall 200 may be constructed of a sufficiently elastic material that resolves the system fragility issue due to shocks. However, there are difficulties in selecting a material that is mechanically sound enough for the overall device, while sufficiently elastic enough to absorb shocks, and also sufficiently opaque at the working wavelength of the time of flight sensor system 100.

Accordingly, in some implementations of the improved time of flight sensor system 100, one or more bumper elements 206, 208 (i.e., elastic elements) separate the opaque central wall 200 from the covering window layer 150, the time of flight sensor layer 110, or both. In some implementations, the bumper material is completely opaque, while in other implementations the bumper material allows for a small optical transmission. In the latter implementations, the opaque central wall 200 can be constructed in height and width with the equations discussed above that are derived without any bumper elements 206, 208. Additionally, field of view-limiting structures, such as the outer opaque walls 210, 220 can be added if appropriate.

Figure 15A:
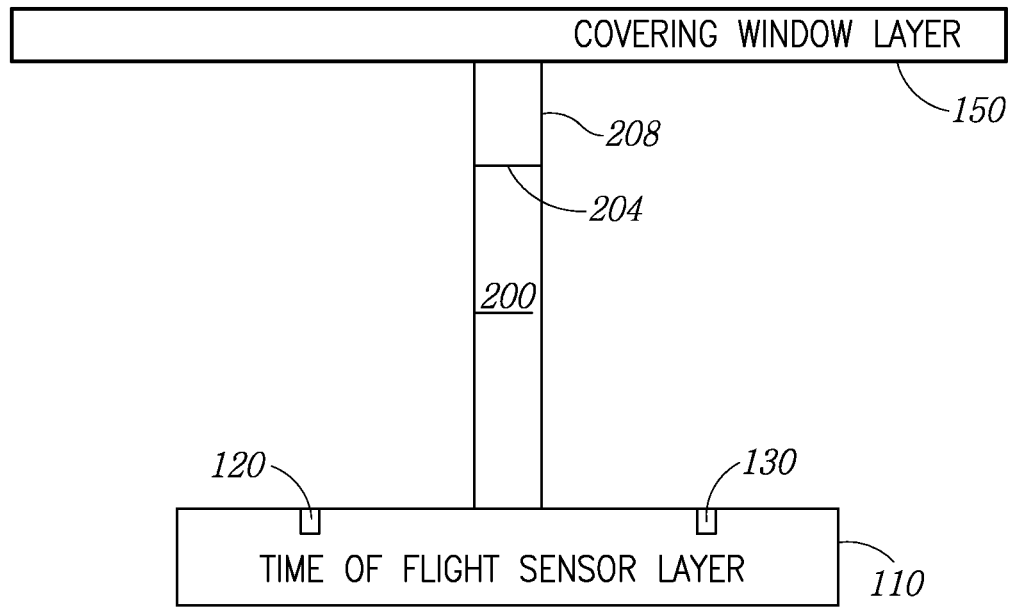
FIG. 15A is a side view of a time of flight sensor in which a single opaque wall is incorporated between an emitting element and a receiving element with a bumper at the covering window end of the wall, according to at least one illustrated implementation.
Figure 15B:
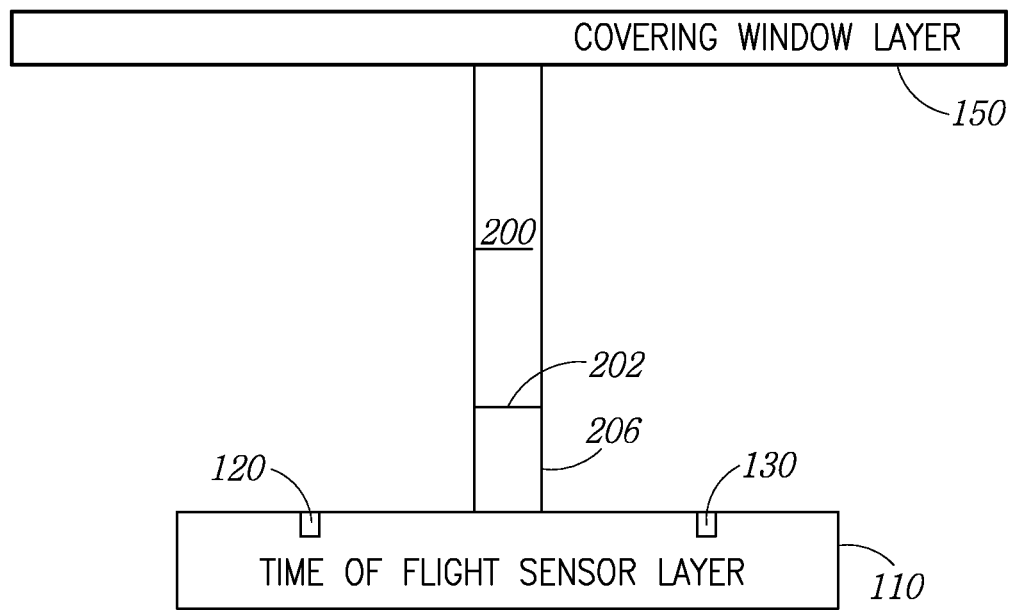
FIG. 15B is a side view of a time of flight sensor in which a single opaque wall is incorporated between an emitting element and a receiving element with a bumper at the time of flight sensor end of the wall, according to at least one illustrated implementation.
Figure 15C:
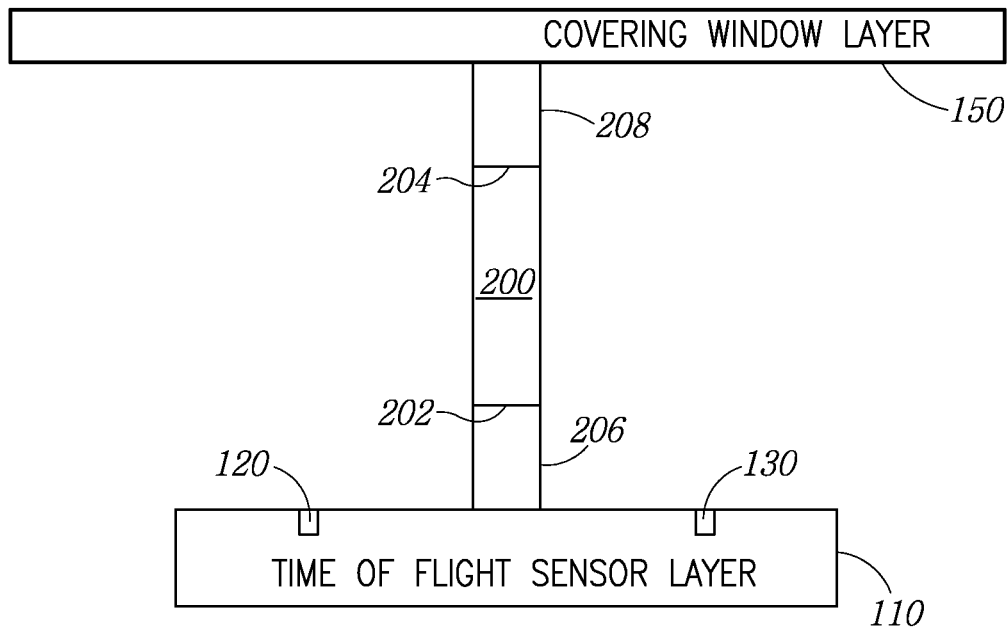
FIG. 15C is a side view of a time of flight sensor in which a single opaque wall is incorporated between an emitting element and a receiving element with a bumper at both ends of the wall, according to at least one illustrated implementation.

Referring now to FIG. 15A, a time of flight sensor system 100 is shown in which a central opaque wall 200 has a window layer end 204 that incorporates a bumper element 208 at the contact point with the covering window layer 150. Referring now to FIG. 15B, a time of flight sensor system 100 is shown in which a central opaque wall 200 has a sensor layer end 202 that incorporates a bumper element 206 at the contact point with the time of flight sensor layer 110. Referring now to FIG. 15C, a time of flight sensor system 100 is shown in which a central opaque wall 200 has a window layer end 204 that incorporates a bumper element 208 at the contact point with the covering window layer 150 and a sensor layer end 202 that incorporates a bumper element 206 at the contact point with the time of flight sensor layer 110.

Figure 16:
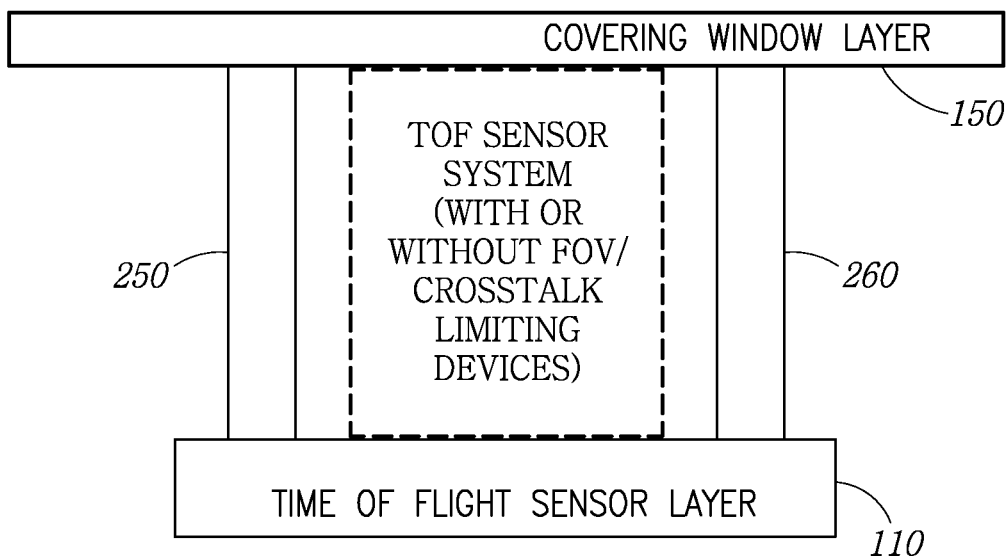
FIG. 16 is a side view of a time of flight sensor in which sealing bumpers are used to circumscribe the emitting and receiving elements, and prevent dust from reaching the emitting and receiving elements, according to at least one illustrated implementation.

As described above, preventing dust from reaching the emitting element 120 and the receiving element 130 is a technological improvement that is provided by the incorporation of the bumper elements 206, 208. As such, as shown in FIG. 16, some implementations of the time of flight sensor system 100 incorporate sealing elements 250, 260 that circumscribe the emitting element 120 and the receiving element 130. In some implementations that incorporate sealing elements 250, 260, the time of flight sensor system 100 is equipped with structures (as described above) for limiting the field of view and/or the crosstalk, while in other implementations that incorporate sealing elements 250, 260, the time of flight sensor system 100 is not equipped with structures for limiting the field of view and/or the crosstalk.

In some implementations of the time of flight sensor system 100, bumper elements may be incorporated into the outer emitter region wall 210 and the outer reception region wall 220, which acts as the field of view-limiting structures. In such implementations, the outer emitter region wall 210 and the outer reception region wall 220 are opaque.

In some implementations, the bumper elements are placed only at the outer emitter region wall 210 and the outer reception region wall 220 (i.e., the field of view-limiting side walls). In other implementations, the bumper elements are placed at the outer emitter region wall 210 and the outer reception region wall 220, as well as at opaque central wall 200. Additionally, the bumper elements may be positioned to contact the covering window layer 150, the time of flight sensor layer 110, and or both the covering window layer 150 and the time of flight sensor layer 110.

Figure 17A:
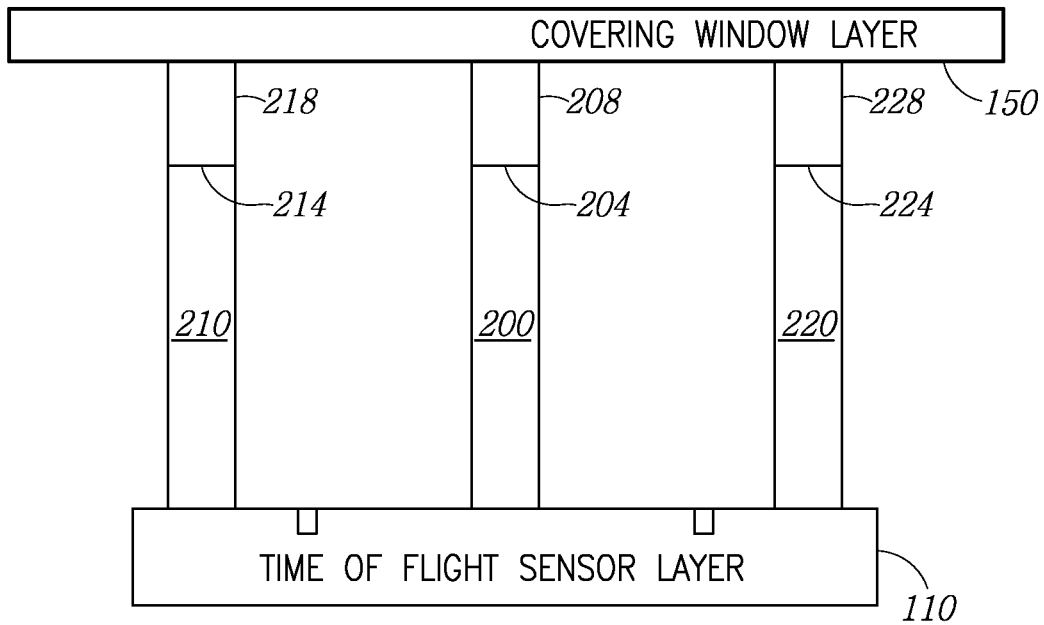
FIG. 17A is a side view of a time of flight sensor in which opaque walls are used to insulate emitting and receiving elements and to limit the field of view, with a bumper at the covering window end of each wall, according to at least one illustrated implementation.
Figure 17B:
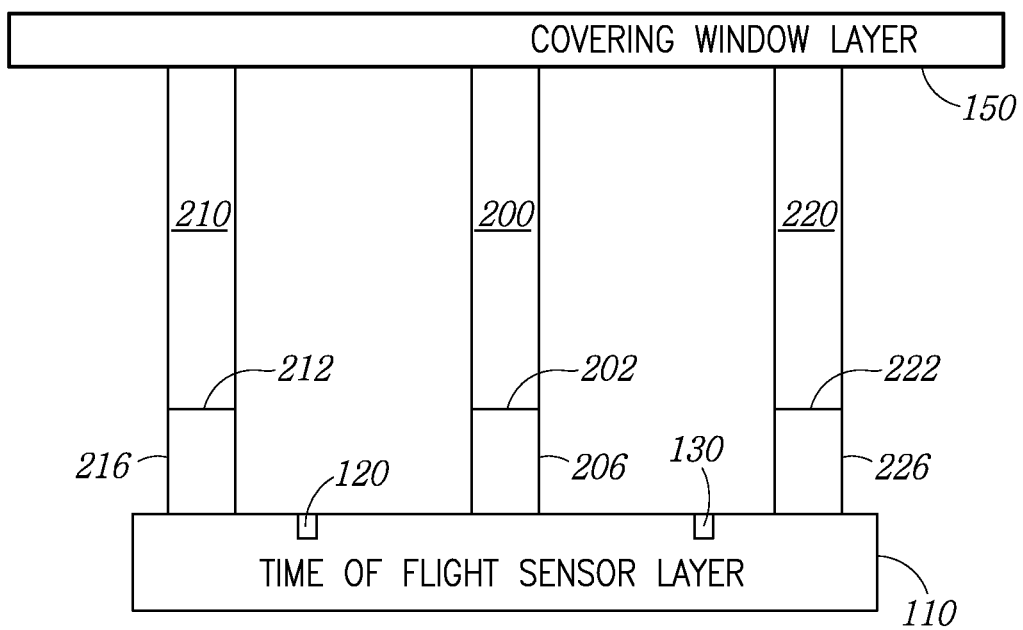
FIG. 17B is a side view of a time of flight sensor in which opaque walls are used to insulate emitting and receiving elements and to limit the field of view, with a bumper at the time of flight sensor end of each wall, according to at least one illustrated implementation.
Figure 17C:
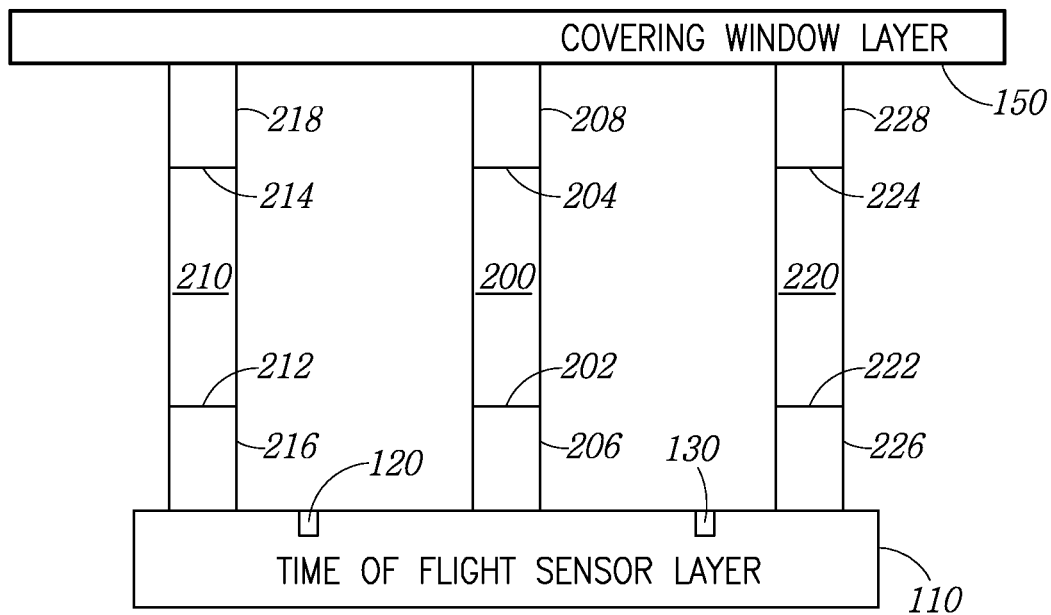
FIG. 17C is a side view of a time of flight sensor in which opaque walls are used to insulate emitting and receiving elements and to limit the field of view, with a bumper at the both ends of each wall, according to at least one illustrated implementation.

Referring now to FIG. 17A, a time of flight sensor system 100 is shown in which the opaque central wall 200, the outer emitter region wall 210, and the outer reception region wall 220 each have window layer ends 204, 214, 224 that each incorporate bumper elements 208, 218, 228 at the contact point with the covering window layer 150. Referring now to FIG. 17B, a time of flight sensor system 100 is shown in which the opaque central wall 200, the outer emitter region wall 210, and the outer reception region wall 220 each have sensor layer ends 202, 212, 222 that each incorporate bumper elements 206, 216, 226 at the contact point with the time of flight sensor layer 110. Referring now to FIG. 17C, a time of flight sensor system 100 is shown in which the opaque central wall 200, the outer emitter region wall 210, and the outer reception region wall 220 (1) each have window layer ends 204, 214, 224 that each incorporate bumper elements 208, 218, 228 at the contact point with the covering window layer 150, and (2) each have sensor layer ends 202, 212, 222 that each incorporate bumper elements 206, 216, 226 at the contact point with the time of flight sensor layer 110.

Figure 18A:
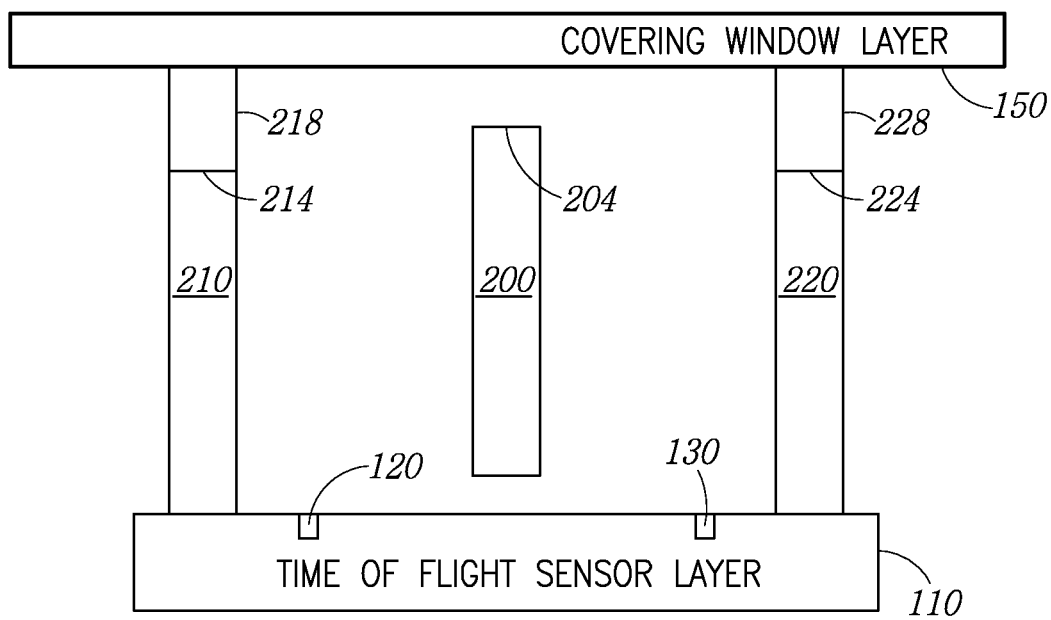
FIG. 18A is a side view of a time of flight sensor in which opaque side walls are used to insulate emitting and receiving elements and to limit the field of view, with a bumper at the covering window end of each side wall and a detached central wall, according to at least one illustrated implementation.
Figure 18B:
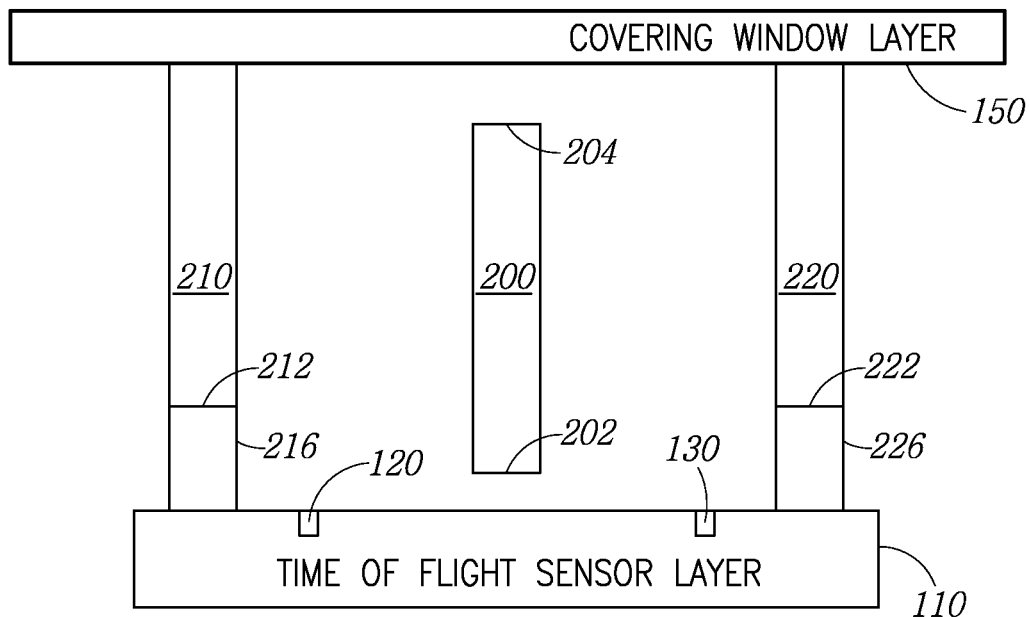
FIG. 18B is a side view of a time of flight sensor in which opaque side walls are used to insulate emitting and receiving elements and to limit the field of view, with a bumper at the time of flight sensor end of each side wall a detached central wall, according to at least one illustrated implementation.
Figure 18C:
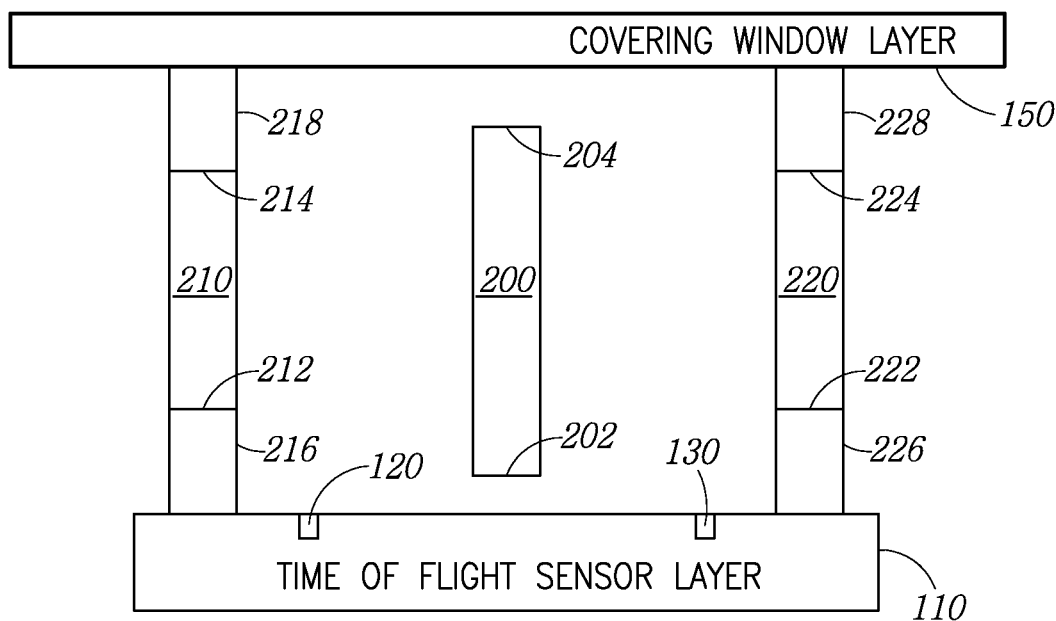
FIG. 18C is a side view of a time of flight sensor in which opaque side walls are used to insulate emitting and receiving elements and to limit the field of view, with a bumper at the both ends of each side wall and a detached central wall, according to at least one illustrated implementation.

Referring now to FIG. 18A, a time of flight sensor system 100 is shown in which the outer emitter region wall 210 and the outer reception region wall 220 each have window layer ends 214, 224 that each incorporate bumper elements 218, 228 at the contact point with the covering window layer 150, while having a detached opaque central wall 200. Referring now to FIG. 18B, a time of flight sensor system 100 is shown in which the outer emitter region wall 210 and the outer reception region wall 220 each have sensor layer ends 212, 222 that each incorporate bumper elements 216, 226 at the contact point with the time of flight sensor layer 110, while having a detached opaque central wall 200. Referring now to FIG. 18C, a time of flight sensor system 100 is shown in which the outer emitter region wall 210 and the outer reception region wall 220 (1) each have window layer ends 214, 224 that each incorporate bumper elements 218, 228 at the contact point with the covering window layer 150, and (2) each have sensor layer ends 212, 222 that each incorporate bumper elements 216, 226 at the contact point with the time of flight sensor layer 110, while having a detached opaque central wall 200. In some implementations of the time of flight sensor system 100, the detached opaque central wall 200 has enhanced (non-planar) crosstalk reducing geometry, as described above, on its sensor layer end 202 and its window layer end 204.

These various implementations described above with respect to FIGS. 17A-18C provide different technical solutions to the technical problems that result from the balancing of mechanical tolerance issues and system fragility against the positioning of a central wall and side walls in contact with the time of flight sensor layer 110 and the covering window layer 150 to reduce crosstalk and address dust particle issues.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, or any combination thereof.

Those of skill in the art will recognize that many of the methods or algorithms set out herein may employ additional acts, may omit some acts, and/or may execute acts in a different order than specified.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A time of flight sensor system having a time of flight sensor layer, wherein emission signals travel away from the time of flight sensor layer and reception signals travel towards the time of flight sensor layer, the system comprising:
   a covering window layer spaced apart from the time of flight sensor layer, the covering window layer including an exit window and an entrance window;
   an emitting element in the time of flight sensor layer that transmits an emission signal towards the exit window in the covering window layer;
   a receiving element in the time of flight sensor layer that receives a reception signal from the entrance window in the covering window layer, the time of flight sensor layer defining a central region between the emitting element and the receiving element, an outer emitter region adjacent to the emitting element and outwardly spaced from the central region, and an outer reception region adjacent to the receiving element and outwardly spaced from the central region;
   three opaque walls that include a central opaque wall, an outer emitter region wall, and an outer reception region wall, wherein each of the three opaque walls is detached from the time of flight sensor layer, detached from the covering window layer, or detached from both the time of flight sensor layer and the covering window layer, wherein the three opaque walls shape an emission signal angle and a reception signal angle, and wherein the three opaque walls insulate the emission and reception signals; and
   light baffles incorporated into each of the three opaque walls that reduce backscatter of emission signals and reception signals, wherein the light baffles are in the form of protrusions and each of the light baffles extend towards an emission signal path to reduce the emission signal angle or extend towards a reception signal path to reduce the reception signal angle.

2. The system of claim 1, wherein a length of each protrusion is tangent to a line defining a working angle of the time of flight sensor, and the length of one of the protrusions is different than the length of another of the protrusions.

3. The system of claim 1, wherein at least one detached end of the three opaque walls has enhanced, non-planar surfaces that reduce crosstalk, wherein crosstalk is signal reception at the receiving element from the emitting element due to unwanted reflection backscatter within the time of flight sensor system.

4. The system of claim 1, wherein a layer of signal absorbing material is secured to covering window layer between the emitting element and the receiving element to tailor a working angle of the emission signal angle and the reception signal angle.

5. The system of claim 1, wherein an opaque material layer is positioned on an upper surface of the covering window layer in the outer reception region.

6. The system of claim 1, wherein the central region is a first central region, the outer emitter region is a first outer emitter region, the outer reception region is a first outer reception region, and wherein the covering window layer defines a second central region between the emitting element and the receiving element, defines a second outer emitter region proximate to the emitting element and outwardly spaced from the second central region, and defines a second outer reception region proximate to the receiving element and outwardly spaced from the second central region, wherein the three opaque walls comprise a first opaque wall that is incorporated on an upper surface of the covering window layer in the second central region, and a second opaque wall that is incorporated on an upper surface of the covering window layer in the second outer reception region.

7. The system of claim 1, wherein the central region is a first central region, the outer emitter region is a first outer emitter region, the outer reception region is a first outer reception region, and wherein the covering window layer defines a second central region between the emitting element and the receiving element, defines a second outer emitter region proximate to the emitting element and outwardly spaced from the second central region, and defines a second outer reception region proximate to the receiving element and outwardly spaced from the second central region, wherein a first opaque material layer is incorporated on an upper surface of the covering window layer in the second central region, and a second opaque material layer is incorporated on an upper surface of the covering window layer in the second outer reception region.

8. The system of claim 1, wherein the three opaque walls each have one or more bumper ends that include a bumper, the three opaque walls each having a bumper end of the one or more bumper ends positioned proximate to the covering window layer, the three opaque walls each having a bumper end of the one or more bumper ends positioned proximate to the time of flight sensor layer, or the three opaque walls each having a first bumper end of the one or more bumper ends positioned proximate to the covering window layer and a second bumper end of the one or more bumper ends positioned proximate to the time of flight sensor layer.

9. A time of flight sensor system having a time of flight sensor layer, wherein emission signals travel away from the time of flight sensor layer and reception signals travel towards the time of flight sensor layer, the system comprising:
a covering window layer spaced apart from the time of flight sensor layer, the covering window layer including an exit window and an entrance window;
an emitting element in the time of flight sensor layer that transmits an emission signal towards the exit window in the covering window layer;
a receiving element in the time of flight sensor layer that receives a reception signal from the entrance window in the covering window layer;
one or more opaque walls extending at least a portion of the distance from the time of flight sensor layer to the covering window layer, the one or more opaque walls reducing reflection backscatter of emission signals and reception signals, the one or more opaque walls shaping an emission signal angle and a reception signal angle, and the one or more opaque walls insulating the emission and reception signals; and
light baffles incorporated into the one or more opaque walls that reduce backscatter of emission signals and reception signals, wherein the light baffles are in the form of protrusions that each extend towards an emission signal path to reduce the emission signal angle or extend towards a reception signal path to reduce the reception signal angle.

10. The system of claim 9, wherein a length of each protrusion is tangent to a line defining a working angle of the time of flight sensor.

11. The system of claim 9, wherein the one or more opaque walls are detached from the time of flight sensor layer, the one or more opaque walls are detached from the covering window layer, or the one or more opaque walls are detached from both the time of flight sensor layer and the covering window layer.

12. The system of claim 11, wherein the one or more opaque walls have a first detached end near the time of flight sensor layer and a second detached end near the covering window layer, the first and second detached ends having enhanced, non-planar surfaces that reduce crosstalk, wherein crosstalk is signal reception at the receiving element from the emitting element due to unwanted reflection backscatter within the time of flight sensor system.

13. The system of claim 9, wherein a layer of signal absorbing material is secured to covering window layer between the emitting element and the receiving element to tailor a working angle of the emission signal angle and the reception signal angle.

14. The system of claim 9, wherein the time of flight sensor layer defines a central region between the emitting element and the receiving element and defines an outer reception region adjacent to the receiving element and outwardly spaced from the central region, wherein the one or more opaque walls comprise a first opaque wall that is incorporated in the central region, and a second opaque wall that is incorporated in the outer reception region to tailor a working angle of the emission signal angle and the reception signal angle.

15. The system of claim 9, wherein the covering window layer defines a central region between the emitting element and the receiving element, defines an outer emitter region proximate to the emitting element and outwardly spaced from the central region, and defines an outer reception region proximate to the receiving element and outwardly spaced from the central region, wherein the one or more opaque walls comprise a single opaque wall that is incorporated in the central region, and wherein an opaque material layer is positioned on an upper surface of the covering window layer in the outer reception region.

16. The system of claim 9, wherein the covering window layer defines a central region between the emitting element and the receiving element, defines an outer emitter region proximate to the emitting element and outwardly spaced from the central region, and defines an outer reception region proximate to the receiving element and outwardly spaced from the central region, wherein the one or more opaque walls comprise a first opaque wall that is incorporated on an upper surface of the covering window layer in the central region, and a second opaque wall that is incorporated on an upper surface of the covering window layer in the outer reception region.

17. The system of claim 9, wherein the covering window layer defines a central region between the emitting element and the receiving element, defines an outer emitter region proximate to the emitting element and outwardly spaced from the central region, and defines an outer reception region proximate to the receiving element and outwardly spaced from the central region, wherein a first opaque material layer is incorporated on an upper surface of the covering window layer in the central region, and a second opaque material layer is incorporated on an upper surface of the covering window layer in the outer reception region.

18. The system of claim 9, wherein the one or more opaque walls comprise a single opaque wall that includes one or more bumpers, the single opaque wall being incorporated between the emitting element and the receiving element, the single opaque wall having a bumper of the one or more bumpers positioned to be in contact with the covering window layer, the single opaque wall having a bumper of the one or more bumpers positioned to be in contact with the time of flight sensor layer, or the single opaque wall having a bumper of the one or more bumpers positioned to be in contact with the covering window layer and a bumper of the one or more bumpers positioned to be in contact with the time of flight sensor layer.

19. The system of claim 9, wherein the one or more opaque walls comprise multiple opaque walls that each include one or more bumpers, the multiple opaque walls each having a bumper of the one or more bumpers positioned to be in contact with the covering window layer, the multiple opaque walls each having a bumper of the one or more bumpers positioned to be in contact with the time of flight sensor layer, or the multiple opaque walls each having a bumper of the one or more bumpers positioned to be in contact with the covering window layer and a bumper of the one or more bumpers positioned to be in contact with the time of flight sensor layer.

20. The system of claim 9, wherein the time of flight sensor layer defines a central region between the emitting element and the receiving element, defines an outer emitter region proximate to the emitting element and outwardly spaced from the central region, and defines an outer reception region proximate to the receiving element and outwardly spaced from the central region,
wherein the one or more opaque walls extending at least a portion of the distance from the time of flight sensor layer to the covering window layer comprise an outer emitter opaque wall in the outer emitter region and an outer reception opaque wall in the outer reception region, wherein the outer emitter opaque wall and the outer reception opaque wall incorporate sealing bumpers that circumscribe the emitting element and receiving element, and prevent dust from reaching the emitting element and receiving element by contacting the time of flight sensor layer and the covering window layer.

21. A time of flight sensor system having a time of flight sensor layer, wherein emission signals travel away from the time of flight sensor layer and reception signals travel towards the time of flight sensor layer, the system comprising:
- a covering window layer spaced apart from the time of flight sensor layer, the covering window layer including an exit window and an entrance window;
- an emitting element in the time of flight sensor layer that transmits an emission signal towards the exit window in the covering window layer;
- a receiving element in the time of flight sensor layer that receives a reception signal from the entrance window in the covering window layer, the time of flight sensor layer defining a central region between the emitting element and the receiving element, an outer emitter region adjacent to the emitting element and outwardly spaced from the central region, and an outer reception region adjacent to the receiving element and outwardly spaced from the central region;
- three opaque walls that include a central opaque wall, an outer emitter region wall, and an outer reception region wall, wherein the central opaque wall has a detached end that is detached from the time of flight sensor layer, a detached end that is detached from the covering window layer, or two detached ends that are detached from both the time of flight sensor layer and the covering window layer, and wherein at least one detached end has enhanced, non-planar surfaces that reduce crosstalk, wherein crosstalk is signal reception at the receiving element from the emitting element due to unwanted reflection backscatter within the time of flight sensor system;
- wherein the outer emitter region wall and the outer reception region wall each include at least one bumper end having a bumper, wherein the outer emitter region wall and the outer reception region wall each have a bumper end positioned to be in contact with the covering window layer, a bumper end positioned to be in contact with the time of flight sensor layer, or a bumper end positioned to be in contact with the covering window layer and a bumper end positioned to be in contact with the time of flight sensor layer; and
- light baffles incorporated into each of the three opaque walls that reduce backscatter of emission signals and reception signals.

* * * * *